US012622176B2

(12) United States Patent (10) Patent No.: US 12,622,176 B2
Ko et al. (45) Date of Patent: *May 5, 2026

(54) VIBRATION APPARATUS AND APPARATUS INCLUDING THE SAME

(71) Applicant: LG Display Co., Ltd., Seoul (KR)

(72) Inventors: Sungwook Ko, Paju-si (KR);
SeungRyull Park, Paju-si (KR);
MinGyu Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 881 days.

This patent is subject to a terminal disclaimer.

(21) Appl. No.: 17/961,724

(22) Filed: Oct. 7, 2022

(65) Prior Publication Data

US 2023/0217830 A1 Jul. 6, 2023

(30) Foreign Application Priority Data

Dec. 31, 2021 (KR) ........................ 10-2021-0194787

(51) Int. Cl.
*H10N 30/50* (2023.01)
*H10N 30/00* (2023.01)
(Continued)

(52) U.S. Cl.
CPC ............. *H10N 30/50* (2023.02); *H10N 30/20* (2023.02); *H10N 30/708* (2024.05); *H10N 30/871* (2023.02)

(58) Field of Classification Search
CPC ...... H10N 30/50; H10N 30/871; H10N 30/20; H10N 30/708; H10N 20/85; H04R 17/00;
(Continued)

(56) References Cited

U.S. PATENT DOCUMENTS

| | | | | |
|---|---|---|---|---|
| 7,151,837 | B2 * | 12/2006 | Bank | ...................... H04R 7/045 |
| | | | | 381/431 |
| 7,174,025 | B2 * | 2/2007 | Azima | ................... H04R 7/045 |
| | | | | 381/152 |
| 2014/0355777 | A1 | 12/2014 | Nabata et al. | |
| 2020/0059733 | A1 | 2/2020 | Shin et al. | |
| 2021/0104658 | A1 | 4/2021 | Ishizaki et al. | |

(Continued)

FOREIGN PATENT DOCUMENTS

| | | |
|---|---|---|
| CN | 103999477 A | 8/2014 |
| CN | 112908222 A | 6/2021 |

(Continued)

OTHER PUBLICATIONS

Extended European Search Report for Application No. 22202111.5, dated May 16, 2023, 8 pages.

(Continued)

*Primary Examiner* — J. San Martin
(74) *Attorney, Agent, or Firm* — Morgan, Lewis & Bockius LLP

(57) ABSTRACT

The vibration apparatus may include a vibration generating portion including a first vibration portion and a second vibration portion overlapping the first vibration portion, a first cover member at a first surface of the vibration generating portion, a second cover member at a second surface different from the first surface of the vibration generating portion, and a signal cable including first, second and third signal lines connected to the first vibration portion and the second vibration portion and disposed between the first cover member and the second cover member. An apparatus for vibration may include a passive vibration member and the vibration apparatus.

35 Claims, 13 Drawing Sheets

(51) Int. Cl.
    *H10N 30/20*           (2023.01)
    *H10N 30/87*           (2023.01)

(58) Field of Classification Search
    CPC ............ H04R 2440/01; H04R 2499/13; H04R
                            2499/15; H10K 59/00
    See application file for complete search history.

(56) References Cited

U.S. PATENT DOCUMENTS

| 2021/0176566 A1 | 6/2021 | Ye |
| 2021/0304920 A1 | 9/2021 | Ko et al. |
| 2021/0352390 A1 | 11/2021 | Lee et al. |
| 2021/0392439 A1 | 12/2021 | Ye |
| 2024/0007798 A1 | 1/2024 | Ye |

FOREIGN PATENT DOCUMENTS

| JP | S55-120187 A | 9/1980 |
| JP | H04-105796 U | 9/1992 |
| JP | 2000350293 A | 12/2000 |
| JP | 2003-47092 A | 2/2003 |
| JP | 2004096225 A | 3/2004 |
| JP | 2021-061336 A | 4/2021 |
| JP | 2021-163765 A | 10/2021 |
| JP | 2021-197737 A | 12/2021 |
| KR | 10-2021-0137855 A | 11/2021 |

OTHER PUBLICATIONS

Office Action dated Dec. 27, 2023 for Japanese Patent Application No. 2022-177297.

Office Action issued in corresponding Chinese Patent Application No. 202211265271.0, dated Jul. 22, 2025. (Note: JP 2004-096225 A, JP 2000-350293 A, JP 2021-061336 A, US 2020/0059733 A1 and US 2021/0392439 A1 were previously cited).

Office Action issued in corresponding Japanese Patent Application No. 2022-177297, dated Dec. 19, 2024. (Note: JP 2003-047092 A, JP 2000-350293 A, JP 2004-096255 A and JP 2021-197737 A were previously cited).

* cited by examiner

VIBRATION APPARATUS AND APPARATUS INCLUDING THE SAME

CROSS-REFERENCE TO RELATED APPLICATIONS

This application claims the benefit of and priority to Korean Patent Application No. 10-2021-0194787 filed on Dec. 31, 2021, the entirety of which is hereby incorporated by reference for all purposes.

BACKGROUND

1. Technical Field

The present disclosure relates to apparatuses and particularly to, for example, without limitation, a vibration apparatus and an apparatus including the same.

2. Discussion of the Related Art

Recently, the need for slimming and thinning electronic devices is increasing. In addition, as speakers applied to electronic devices and the like need to be slim and thin, instead of voice coils, piezoelectric elements capable of realizing a thin thickness are attracting much attention.

Speakers or vibration apparatuses with a piezoelectric element applied thereto may be driven or vibrated by a driving power or a driving signal supplied through a signal cable.

General vibration apparatuses (or film actuators) include a film which includes a pad electrode and a line for applying a driving power to a piezoelectric element. The general vibration apparatuses need a process of patterning the line and the pad electrode on the film and a soldering process of electrically connecting the pad electrode to a signal cable.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

The inventors have recognized the problems described above as well as the problems and disadvantages of the related art and have performed extensive research and experiments for implementing a vibration apparatus in which a manufacturing process and a structure of the vibration apparatus may be simplified. Through the extensive research and experiments, the inventors have invented a vibration apparatus having a new structure and an apparatus including the same, in which a manufacturing process and a structure of the vibration apparatus may be simplified.

One or more aspects of the present disclosure are directed to providing a vibration apparatus and an apparatus including the same, in which a manufacturing process and a structure may be simplified.

One or more aspects of the present disclosure are directed to providing a vibration apparatus and an apparatus including the same, in which a sound characteristic may be enhanced.

Accordingly, one or more example embodiments of present disclosure are directed to an apparatus that substantially obviates one or more of the problems due to limitations and disadvantages of the related art.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the appended drawings.

To achieve these and other advantages and aspects of the present disclosure, as embodied and broadly described herein, in one or more aspects, a vibration apparatus may comprise a vibration generating portion including a first vibration portion and a second vibration portion overlapping the first vibration portion, a first cover member at a first surface of the vibration generating portion, a second cover member at a second surface different from the first surface, and a signal cable including first to third signal lines connected to the first vibration portion and the second vibration portion and disposed between the first cover member and the second cover member.

In one or more aspects, an apparatus may comprise a passive vibration member, and a vibration generating apparatus connected to the passive vibration member and configured to include a vibration apparatus to vibrate the passive vibration member. The vibration apparatus may comprise a vibration generating portion including a first vibration portion and a second vibration portion overlapping the first vibration portion, a first cover member at a first surface of the vibration generating portion, a second cover member at a second surface different from the first surface, and a signal cable including first to third signal lines connected to the first vibration portion and the second vibration portion and disposed between the first cover member and the second cover member.

According to one or more example embodiments of the present disclosure, a vibration apparatus and an apparatus including the same, where a manufacturing process and a structure of the vibration apparatus may be simplified, may be provided.

According to one or more example embodiments of the present disclosure, a vibration apparatus and an apparatus including the same, where a reduction in sound characteristic may be minimized despite using an electrode having a high surface resistance, may be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure.

Figure 1:
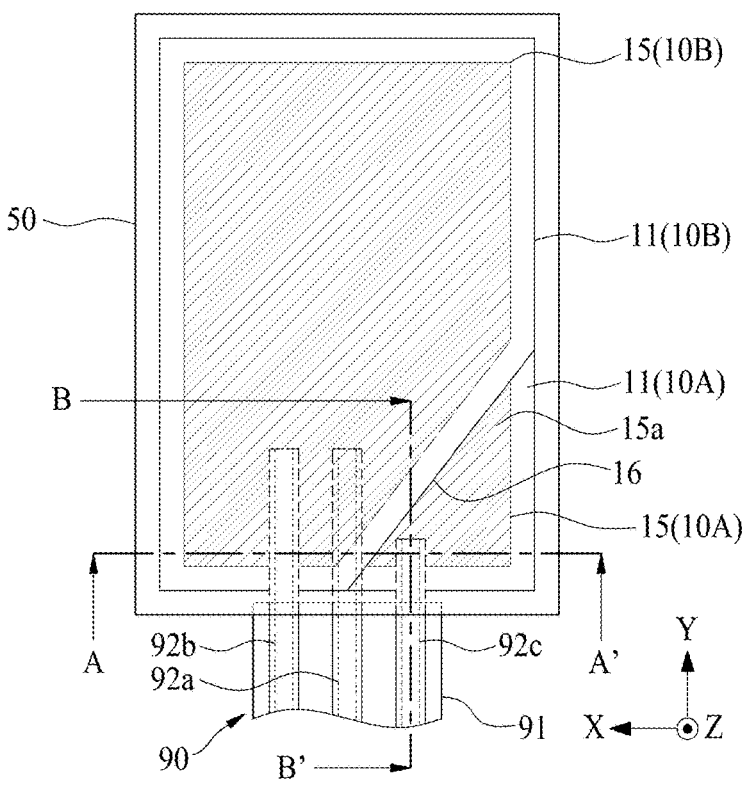
FIG. 1 illustrates a vibration apparatus according to a first example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below,"

"beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

Hereinafter, various example embodiments of the present disclosure are described in detail with reference to the accompanying drawings. In addition, for convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

Figure 2:
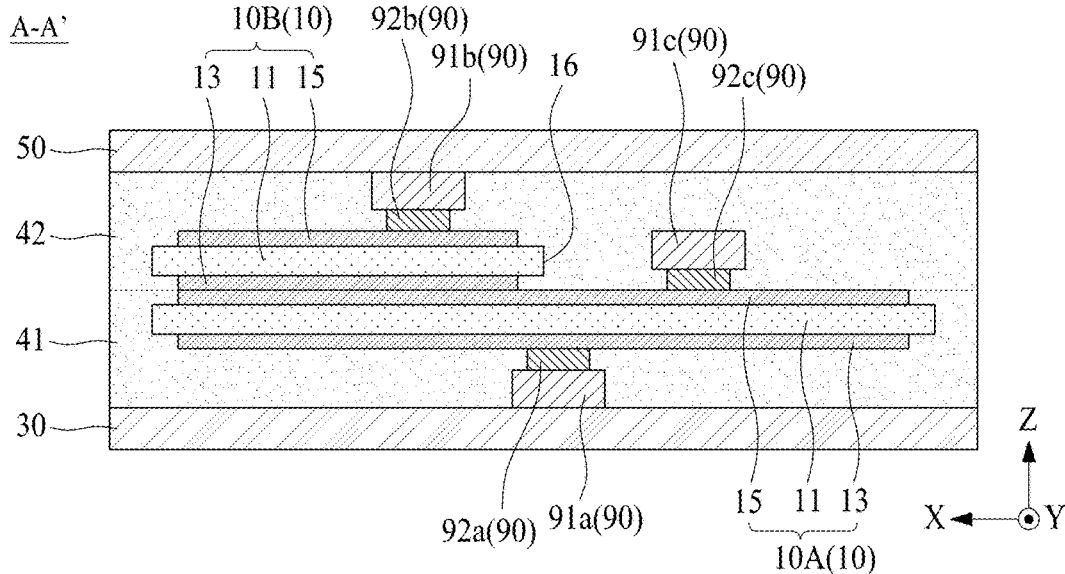
FIG. 2 is an example of a cross-sectional view taken along line A-A' illustrated in FIG. 1.
Figure 3:
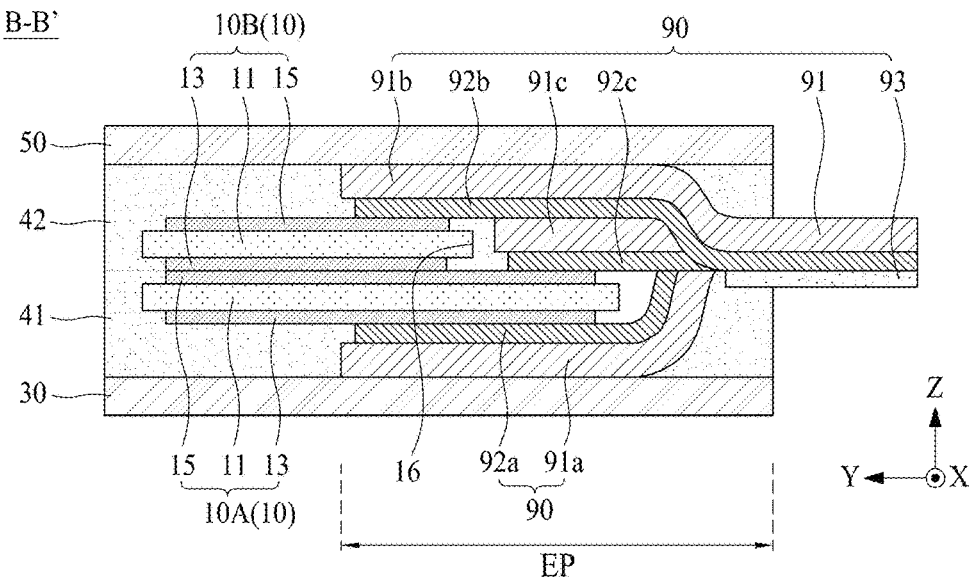
FIG. 3 is an example of a cross-sectional view taken along line B-B' illustrated in FIG. 1.
Figure 4:
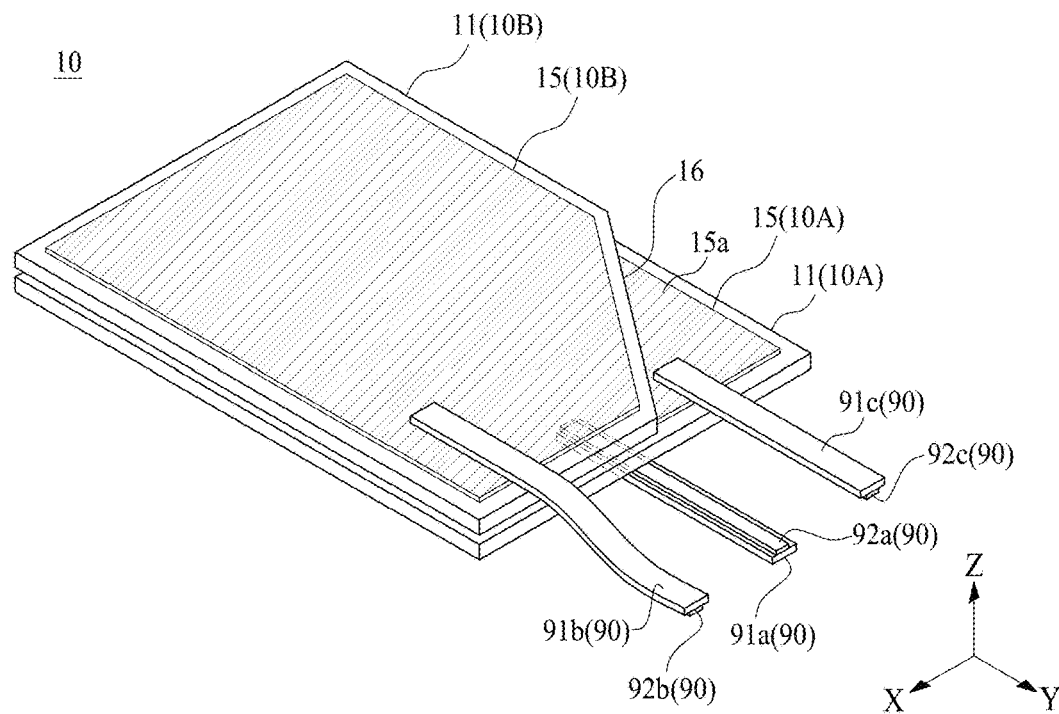
FIG. 4 is an example of a perspective view illustrating a connection structure between a signal cable and a vibration generating portion illustrated in FIGS. 1 to 3.

FIG. 1 illustrates a vibration apparatus according to a first example embodiment of the present disclosure. FIG. 2 is an example of a cross-sectional view taken along line A-A' illustrated in FIG. 1. FIG. 3 is an example of a cross-sectional view taken along line B-B' illustrated in FIG. 1. FIG. 4 is an example of a perspective view illustrating a connection structure between a signal cable and a vibration generating portion illustrated in FIGS. 1 to 3.

With reference to FIGS. 1 to 4, a vibration apparatus according to the first example embodiment of the present disclosure may include a vibration generating portion 10, a first cover member 30, a second cover member 50, and a signal cable 90.

The vibration generating portion 10 may include a plurality of vibration portions 10A and 10B which are overlapped or superimposed each other. For example, the vibration generating portion 10 may include the plurality of vibration portions 10A and 10B which are stacked or superimposed each other. For example, the vibration generating portion 10 may include a first vibration portion 10A and a second vibration portion 10B which is stacked on the first vibration portion 10A.

The plurality of vibration portions 10A and 10B or the first and second vibration portions 10A and 10B may be connected to or contact each other. For example, the plurality of vibration portions 10A and 10B or the first and second vibration portions 10A and 10B may be connected to or contact each other without an intermediate medium such as a connection member or a contact member, or the like. The plurality of vibration portions 10A and 10B or the first and second vibration portions 10A and 10B may be directly connected to or directly contact each other. For example, the plurality of vibration portions 10A and 10B or the first and second vibration portions 10A and 10B may be directly connected to or directly contact each other without an intermediate medium such as a connection member or a contact member. For convenience of description, an example where the vibration generating portion 10 includes the first and second vibration portions 10A and 10B will be described with reference to FIGS. 1 to 4.

Each of the first vibration portion 10A and the second vibration portion 10B may include a piezoelectric material (or an electroactive material) or a piezoelectric element which includes a piezoelectric effect. For example, the piezoelectric material (or the piezoelectric element) may have a characteristic in which, when pressure or twisting is applied to a crystalline structure by an external force, a potential difference occurs due to dielectric polarization caused by a relative position change of a positive (+) ion and a negative (−) ion, and a vibration is generated by an electric field based on a reverse voltage applied thereto.

Each of the first vibration portion 10A and the second vibration portion 10B may include a vibration layer 11, a first electrode layer 13, and a second electrode layer 15.

The vibration layer 11 may include a piezoelectric material (or an electroactive material) which includes a piezoelectric effect. The vibration layer 11 may include a ceramic-based material capable of implementing a relatively high vibration, or may include piezoelectric ceramic having a perovskite-based crystal structure.

The piezoelectric ceramic may include single crystalline ceramic having a crystalline structure, or may include a ceramic material having a polycrystalline structure or polycrystalline ceramic. A piezoelectric material including single crystalline ceramic may include $\alpha$-AlPO$_4$, $\alpha$-SiO$_2$, LiNbO$_3$, Tb$_2$(MoO$_4$)$_3$, Li$_2$B$_4$O$_7$, or ZnO, or the like, but embodiments of the present disclosure are not limited thereto. A piezoelectric material including polycrystalline ceramic may include a lead zirconate titanate (PZT)-based material, including lead (Pb), zirconium (Zr), and titanium (Ti), or may include a lead zirconate nickel niobate (PZNN)-based material, including lead (Pb), zirconium (Zr), nickel (Ni), and niobium (Nb), but embodiments of the present disclosure are not limited thereto. Alternatively, the vibration layer 11 may include at least one or more of calcium titanate (CaTiO$_3$), BaTiO$_3$, and SrTiO$_3$, each without lead (Pb), but embodiments of the present disclosure are not limited thereto.

According to an example embodiment of the present disclosure, a vibration layer 11 of each of the first vibration portion 10A and the second vibration portion 10B may have the same ceramic crystal structure, or may have different ceramic structures. For example, each of the vibration layer 11 of the first vibration portion 10A and the vibration layer 11 of the second vibration portion 10B may include single crystalline ceramic or polycrystalline ceramic. For example, any one of the vibration layer 11 of the first vibration portion 10A and the vibration layer 11 of the second vibration portion 10B may include single crystalline ceramic, and the other may include polycrystalline ceramic.

The first electrode layer 13 may be disposed at a first surface (or a lower surface) of the vibration layer 11. The first electrode layer 13 may have the same size as the vibration layer 11, or may have a size which is smaller than the vibration layer 11.

The second electrode layer 15 may be disposed at a second surface (or an upper surface) which is opposite to or different from the first surface of the vibration layer 11. The second electrode layer 15 may have the same size as the vibration layer 11, or may have a size which is smaller than the vibration layer 11. For example, the second electrode layer 15 may have the same shape as the vibration layer 11, but embodiments of the present disclosure are not limited thereto.

In a stack structure of the first and second vibration portions 10A and 10B, in order to prevent electrical short circuit between vertically adjacent electrode layers, each of the first electrode layer 13 and the second electrode layer 15 may be formed at the other portion, except a periphery portion, of the vibration layer 11. For example, a distance between a lateral surface (or a sidewall) of each of the first electrode layer 13 and the second electrode layer 15 and a lateral surface (or a sidewall) of the vibration layer 11 may be at least 0.5 mm or more. For example, the distance between the lateral surface of each of the first electrode layer 13 and the second electrode layer 15 and the lateral surface of the vibration layer 11 may be at least 1 mm or more, but embodiments of the present disclosure are not limited thereto.

One or more of the first electrode layer 13 and the second electrode layer 15 according to an example embodiment of the present disclosure may be formed of a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include gold (Au), silver (Ag), platinum (Pt), palladium (Pd), molybdenum (Mo), magnesium (Mg), carbon, or silver (Ag) including glass frit, or the like, or may be formed of an alloy thereof, but embodiments of the present disclosure are not limited thereto. According to another example embodiment of the present disclosure, in order to enhance an electrical characteristic and/or a vibration characteristic of the vibration layer 11, each of the first electrode layer 13 and the second electrode layer 15 may include silver (Ag) having a low resistivity. For example, carbon may be carbon black, ketjen black, carbon nanotube, and a carbon material including graphite, but embodiments of the present disclosure are not limited thereto.

In the first electrode layer 13 and the second electrode layer 15 including silver (Ag) including glass frit, a content of the glass frit may be 1 wt % to 12 wt %, but embodiments of the present disclosure are not limited thereto. The glass frit may include PbO or $Bi_2O_3$-based material, but embodiments of the present disclosure are not limited thereto.

According to an example embodiment of the present disclosure, the second electrode layer 15 of the first vibration portion 10A may electrically contact or be electrically connected to the first electrode layer 13 of the second vibration portion 10B. For example, the second electrode layer 15 of the first vibration portion 10A may directly contact or be directly connected to the first electrode layer 13 of the second vibration portion 10B. For example, the second electrode layer 15 of the first vibration portion 10A may be directly connected or electrically and directly contact the first electrode layer 13 of the second vibration portion 10B without an intermediate medium such as a connection member or a contact member, or the like. Therefore, the second electrode layer 15 of the first vibration portion 10A and the first electrode layer 13 of the second vibration portion 10B may be a third electrode layer, a middle electrode layer, an inner electrode layer, and a common electrode layer of the vibration generating portion 10, but embodiments of the present disclosure are not limited thereto.

The vibration layer 11 may be polarized (or poling) by a certain voltage applied to the first electrode layer 13 and the second electrode layer 15 in a certain temperature atmosphere, or a temperature atmosphere that may be changed from a high temperature to a room temperature, but embodiments of the present disclosure are not limited thereto. For example, the vibration layer 11 may alternately and repeatedly contract or expand based on an inverse piezoelectric effect according to a sound signal (or a voice signal or a driving signal) applied to the first electrode layer 13 and the second electrode layer 15 from the outside to vibrate. For example, the vibration layer 11 may vibrate based on a vertical-direction vibration and a planar direction vibration by the sound signal applied to the first electrode layer 13 and the second electrode layer 15. The vibration layer 11 may increase the displacement of a vibration member by contraction and/or expansion of the planar direction, thereby further improving the vibration of the vibration member.

The vibration layer 11 of the first vibration portion 10A and the vibration layer 11 of the second vibration portion 10B may be polarized in the same direction, or may be polarized in opposite directions. For example, a polarization direction formed in the vibration layer 11 of the first vibration portion 10A may be an opposite direction of a polarization direction formed in the vibration layer 11 of the second vibration portion 10B. According to an example embodiment of the present disclosure, the second electrode layer 15 of the first vibration portion 10A may be connected to the first electrode layer 13 of the second vibration portion 10B, and thus, when the polarization direction formed in the vibration layer 11 of the first vibration portion 10A is the opposite direction of the polarization direction formed in the vibration layer 11 of the second vibration portion 10B, the first vibration portion 10A and the second vibration portion 10B may be displaced (or vibrate or driven) in the same direction, whereby a vibration width (or a displacement width) of the vibration generating portion 10 may be maximized, and thus, a sound pressure level may be enhanced.

According to an example embodiment of the present disclosure, any one of the first vibration portion 10A and the second vibration portion 10B may be implemented to expose a partial region of the other one vibration portion. Any one of the first vibration portion 10A and the second vibration portion 10B may be implemented so that a partial region (or a portion) of the other one vibration portion is exposed toward the second cover member 50.

The vibration apparatus or the vibration generating portion 10 according to the first example embodiment of the present disclosure may further include a cut portion 16 which is implemented in any one of the first vibration portion 10A and the second vibration portion 10B.

Any one of the first vibration portion 10A and the second vibration portion 10B may include the cut portion 16. The cut portion 16 may be implemented in any one of the first vibration portion 10A and the second vibration portion 10B so as to expose a portion of the third electrode layer (or an inner electrode) of the vibration generating portion 10. For example, the cut portion 16 may be implemented by cutting or chamfering a portion of any one of the first vibration portion 10A and the second vibration portion 10B. For example, the cut portion 16 may be implemented to include one or more of a rectilinear shape and a curved shape. For example, the cut portion 16 may be a corner cut portion, a chamfer portion, a corner rounding portion, an inner electrode exposure portion, a common electrode exposure portion, a middle electrode exposure portion, or an inner exposure portion, but embodiments of the present disclosure are not limited thereto.

According to an example embodiment of the present disclosure, because any one of the first vibration portion 10A and the second vibration portion 10B includes the cut portion 16, the first vibration portion 10A and the second vibration portion 10B may have different shapes. For example, any one of the first vibration portion 10A and the second vibration portion 10B may include four sides, and the other may include five or more sides. For example, any one of the first vibration portion 10A and the second vibration portion 10B may have a tetragonal shape or a rectangular shape including four sides, and the other one may have a pentagonal shape where one corner portion of a tetragonal shape including four corners is cut or chamfered, but embodiments of the present disclosure are not limited thereto.

The cut portion 16 according to an example embodiment of the present disclosure may be implemented to expose a portion of a third electrode layer (or an inner electrode) of the vibration generating portion 10.

The second vibration portion 10B according to an example embodiment of the present disclosure may include a cut portion 16 for exposing a partial region (or a portion) of a region of the first vibration portion 10A. For example, the second vibration portion 10B may include the cut portion 16 for exposing a partial region of a region of the first vibration portion 10A toward the second cover member 50. For example, the second vibration portion 10B may include the cut portion 16 for exposing an electrode layer, disposed closer to the second cover member 50 among the first and second electrode layers 13 and 15 of the first vibration portion 10A, toward the second cover member 50.

The cut portion 16 may be implemented by removing a portion of a region of the second vibration portion 10B, so as to expose an electrode layer disposed closer to the second cover member 50 among the first and second electrode layers 13 and 15 of the first vibration portion 10A. For example, the cut portion 16 may be implemented by cutting or chamfering a first corner of four corners of the second vibration portion 10B. For example, the cut portion 16 may be implemented to include one or more of a rectilinear shape and a curved shape.

The first vibration portion 10A according to an example embodiment of the present disclosure may be exposed through the cut portion 16 of the second vibration portion 10B. For example, the first vibration portion 10A may be exposed through the cut portion 16 of the second vibration portion 10B to face the second cover member 50. For example, an electrode layer disposed closer to the second cover member 50 among the first and second electrode layers 13 and 15 of the first vibration portion 10A may face the second cover member 50 through the cut portion 16 of the second vibration portion 10B. For example, the second electrode layer 15 of the first vibration portion 10A may face or be exposed at the second cover member 50 through the cut portion 16 of the second vibration portion 10B.

The first cover member 30 may be disposed at a first surface of the vibration generating portion 10. For example, the first cover member 30 may be configured to cover the first vibration portion 10A of the vibration generating portion 10. For example, the first cover member 30 may be configured to cover a first electrode layer 13 of the first vibration portion 10A. Accordingly, the first cover member 30 may protect the first surface of the vibration generating portion 10 or the first vibration portion 10A. For example, the first cover member 30 may be configured to cover an electrode layer far away from the second vibration portion 10B among the first and second electrode layers 13 and 15 of the first vibration portion 10A. For example, the first cover member 30 may protect a first surface of the vibration generating portion 10 and the first electrode layer 13 of the first vibration portion 10A.

The second cover member 50 may be disposed at a second surface of the vibration generating portion 10. For example, the second cover member 50 may be configured to cover the second vibration portion 10B of the vibration generating portion 10. For example, the second cover member 50 may be configured to cover a second electrode layer 15 of the second vibration portion 10B. Accordingly, the second cover member 50 may protect the second surface of the vibration generating portion 10 or the second vibration portion 10B. For example, the second cover member 50 may be configured to cover an electrode layer far away from the first vibration portion 10A among the first and second electrode layers 13 and 15 of the second vibration portion 10B. For example, the second cover member 50 may protect a second surface of the vibration generating portion 10 and the second electrode layer 15 of the second vibration portion 10B, and may protect an exposure region 15a of the first vibration portion 10A exposed by the cut portion 16.

Each of the first cover member 30 and the second cover member 50 according to an example embodiment of the present disclosure may each include one or more material of plastic, fiber, cloth, paper, leather, rubber, and wood, but embodiments of the present disclosure are not limited thereto. For example, each of the first cover member 30 and the second cover member 50 may include the same material or different material. For example, each of the first cover member 30 and the second cover member 50 may be a polyimide (PI) film or a polyethylene terephthalate (PET) film, but embodiments of the present disclosure are not limited thereto.

One or more of the first cover member 30 and the second cover member 50 according to another example embodiment of the present disclosure may include an adhesive member. For example, one or more of the first cover member 30 and the second cover member 50 may include an adhesive member which is coupled to or attached on the vibration portion 10A and 10B and a protection member (or a stripping member or a delamination member) which covers or protects the adhesive member. For example, the adhesive member may include an electrical insulation material which has adhesive properties and is capable of compression and decompression. For example, the first cover member 30 may include an adhesive member which is coupled to or attached on the vibration portion 10A and 10B and a protection member (or a stripping member) which covers or protects the adhesive member.

The first cover member 30 may be connected or coupled to at least a portion of the first surface of the vibration generating portion 10 or the first electrode layer 13 of the first vibration portion 10A by a first adhesive layer 41. For example, the first cover member 30 may be connected or coupled to at least a portion of the first surface of the vibration generating portion 10 or the first electrode layer 13 of the first vibration portion 10A by a film laminating process using the first adhesive layer 41.

The second cover member 50 may be connected or coupled to at least a portion of the second surface of the vibration generating portion 10 or the second electrode layer 15 of the second vibration portion 10B by a second adhesive layer 42. For example, the second cover member 50 may be connected or coupled to at least a portion of the second surface of the vibration generating portion 10 or the second electrode layer 15 of the second vibration portion 10B by a film laminating process using the second adhesive layer 42.

Each of the first adhesive layer 41 and second adhesive layer 42 according to an example embodiment of the present disclosure may include an electric insulating material which has adhesiveness and is capable of compression and decompression. For example, each of the first adhesive layer 41 and the second adhesive layer 42 may include an epoxy resin, an acrylic resin, a silicone resin, or a urethane resin, but embodiments of the present disclosure are not limited thereto.

The signal cable 90 may be implemented to be connected to each of the first and second vibration portions 10A and 10B of the vibration generating portion 10 at one side of the vibration generating portion 10. The signal cable 90 may be connected to each of the first and second vibration portions 10A and 10B, between the first cover member 30 and the second cover member 50.

An end portion (or a distal end portion) of the signal cable 90 may be disposed at or inserted into a region (or a portion) between one periphery portion EP of the first cover member 30 and one periphery portion EP of the second cover member 50. The one periphery portion EP of the first cover member 30 and the one periphery portion EP of the second cover member 50 may accommodate a portion of the signal cable 90, or may vertically cover the portion of the signal cable 90. Accordingly, the signal cable 90 may be integrated with the vibration generating portion 10 or may be configured as one body with the vibration generating portion 10. For example, the vibration apparatus according to the first example embodiment of the present disclosure may be a vibration apparatus which is integrated with the signal cable 90 or configured as one body with the signal cable 90. For example, the signal cable 90 may be a flexible cable, a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The signal cable 90 according to an example embodiment of the present disclosure may include (or may be) a base member 91 and a plurality of signal lines 92a, 92b, and 92c. For example, the signal cable 90 may include a base member 91 and first to third signal lines 92a, 92b, and 92c.

The base member 91 may include a transparent or opaque plastic material. For example, the base member 91 may be implemented with any one or more of synthetic resins including a fluorine resin, a polyimide-based resin, a polyurethane-based resin, a polyester-based resin, a polyethylene-based resin, and a polypropylene-based resin, but embodiments are not limited thereto. The base member 91 may be a base film or a base insulation film, but embodiments are not limited thereto.

The base member 91 may have a certain width in a first direction X and may extend long along a second direction Y intersecting with the first direction X.

Each of the first to third signal lines (or a plurality of signal lines) 92a, 92b, and 92c may be disposed on a first surface of the base member 91 in parallel with the second direction Y and may be spaced apart from or separated from one another along the first direction X. Each of the first to third signal lines (or a plurality of signal lines) 92a, 92b, and 92c may be disposed in parallel to each other at the first surface of the base member 91. For example, each of the first to third signal lines (or a plurality of signal lines) 92a, 92b, and 92c may be implemented in a line shape through patterning of a metal layer (or a conductive layer) formed or deposited at the first surface of the base member 91.

An end portion (or a distal end portion) of each of the first to third signal lines 92a, 92b, and 92c may be spaced apart from one another, and thus, may be curved or bent individually.

An end portion (or a distal end portion) of the first signal line 92a may be electrically connected to an electrode layer close to the first cover member 30 among the first and second electrode layers 13 and 15 of the first vibration portion 10A. For example, the end portion of the first signal line 92a may be electrically connected to at least a portion of the first electrode layer 13 of the first vibration portion 10A at one periphery portion EP of the first cover member 30. For example, the end portion of the first signal line 92a may be electrically and directly connected to at least a portion of the first electrode layer 13 of the first vibration portion 10A. The end portion of the first signal line 92a may be directly connected to or directly contact the first electrode layer 13 of the first vibration portion 10A. Therefore, the first signal line 92a may supply a first driving signal, supplied from a vibration driving circuit, to the first electrode layer 13 of the first vibration portion 10A.

An end portion (or a distal end portion) of the second signal line 92b may be electrically connected to an electrode layer close to the second cover member 50 among the first and second electrode layers 13 and 15 of the second vibration portion 10B. For example, the end portion of the second signal line 92b may be electrically connected to at least a portion of the second electrode layer 15 of the second vibration portion 10B at one periphery portion EP of the second cover member 50. For example, the end portion of the second signal line 92b may be electrically and directly connected to at least a portion of the second electrode layer 15 of the second vibration portion 10B. The end portion of the second signal line 92b may be directly connected to or directly contact the second electrode layer 15 of the second vibration portion 10B. Therefore, the second signal line 92b may supply a second driving signal, supplied from a vibration driving circuit, to the second electrode layer 15 of the second vibration portion 10B. For example, the second driving signal may have the same phase as the first driving signal.

An end portion (or a distal end portion) of the third signal line 92c may be electrically connected to an electrode layer close to the second cover member 50 among the first and second electrode layers 13 and 15 of the first vibration portion 10A at the cut portion 16 implemented in the second vibration portion 10B. For example, the end portion of the third signal line 92c may be electrically connected to at least a portion of the second electrode layer 15 of the first vibration portion 10A at one periphery portion EP of the second cover member 50. For example, the end portion of the third signal line 92c may be electrically connected to at least a portion of the exposure region 15a of the second electrode layer 15 of the first vibration portion 10A exposed by the cut portion 16 of the second vibration portion 10B. For example, the end portion of the third signal line 92c may be directly connected to or directly contact the second electrode layer 15 of the first vibration portion 10A. Therefore, the third signal line 92c may supply a third driving signal, supplied from the vibration driving circuit, to the second electrode layer 15 of the first vibration portion 10A. Accordingly, the third driving signal may be supplied to the first electrode layer 13 of the second vibration portion 10B through the second electrode layer 15 of the first vibration portion 10A. For example, the third driving signal may have an inverse phase with respect to the first driving signal or the second driving signal.

In the first vibration portion 10A, the first electrode layer 13 may receive the first driving signal through the first signal line 92a, and the second electrode layer 15 may receive the third driving signal through the third signal line 92c. Accordingly, the first vibration portion 10A may vibrate (or displace or drive) by alternately repeat contraction and expansion based on an inverse piezoelectric effect occurring in the vibration layer 11 according to the first and third driving signals.

In the second vibration portion 10B, the first electrode layer 13 may receive the third driving signal through the third signal line 92c and the second electrode layer 15 of the first vibration portion 10A, and the second electrode layer 15 may receive the second driving signal through the second signal line 92b. Accordingly, the second vibration portion 10B may vibrate (or displace or drive) by alternately repeat contraction and expansion based on an inverse piezoelectric effect occurring in the vibration layer 11 according to the second and third driving signals.

Each of the first vibration portion 10A and the second vibration portion 10B may be flexed (or displaced or driven) in the same shape. Therefore, in the vibration generating portion 10 or the vibration apparatus, a vibration width (or a displacement width) of the first vibration portion 10A and a vibration width (or a displacement width) of the second vibration portion 10B may be summated and maximized. For example, in the vibration generating portion 10 or the vibration apparatus, a vibration of the first vibration portion 10A and a vibration of the second vibration portion 10B may be reinforced, and thus, vibration efficiency or a vibration characteristic may be enhanced and a vibration width (or a displacement width) may be maximized, thereby enhancing a sound characteristic and/or a sound pressure level characteristic of a low-pitched sound band.

The signal cable 90 according to an example embodiment of the present disclosure may further include an insulation member 93.

The insulation member 93 may be disposed at the first surface of the base member 91 to cover each of the first to third signal lines 92a, 92b, and 92c other than the end portion of the signal cable 90. The insulation member 93 may be an insulation layer, a protective layer, a cover layer, a cover layer film, a cover film, or a cover insulation film, but embodiments are not limited thereto.

The signal cable 90 or the base member 91 may include a first extension portion 91a which supports an end portion of the first signal line 92a. The first extension portion 91a may extend along the second direction Y from an end of the insulation member 93 covering the first signal line 92a disposed at the base member 91 and may support the first signal line 92a. The first signal line 92a may be disposed at a top surface (or an upper surface) of the first extension portion 91a so as to be directly connected to the first vibration portion 10A.

The signal cable 90 or the base member 91 may include second and third extension portions 91b and 91c which individually support end portions of the second and third signal lines 92b and 92c. The second extension portion 91b may extend along the second direction Y from an end of the base member 91 and may support the second signal line 92b. The second signal line 92b may be disposed at a bottom surface (or a lower surface) of the second extension portion 91b so as to be directly connected to the second vibration portion 10B. The third extension portion 91c may extend along the second direction Y from the end of the base member 91 and may support the third signal line 92c. The third signal line 92c may be disposed at a bottom surface (or a lower surface) of the third extension portion 91c so as to be directly connected to the first vibration portion 10A.

The signal cable 90 may include the first to third extension portions 91a, 91b, and 91c which respectively support end portions of the first to third signal lines 92a, 92b, and 92c spaced apart (or separated) from one another. For example, the first to third extension portions 91a, 91b, and 91c may be spaced apart (or separated) from one another between one periphery portion EP of the first cover member 30 and one periphery portion EP of the second cover member 50. Accordingly, the end portions (or the distal end portions) of the first to third signal lines 92a, 92b, and 92c may be spaced apart (or separated) from one another and may be individually flexed or bent.

According to another example embodiment of the present disclosure, each of the first to third extension portions 91a, 91b, and 91c of the signal cable 90 or the base member 91 may be omitted. For example, each of the first to third signal lines 92a, 92b, and 92c may extend or protrude in a finger shape from an end portion of the base member 91 and may be electrically connected to or electrically contact each of the corresponding electrode layers 13 and 15, between the one periphery portion EP of the first cover member 30 and the one periphery portion EP of the second cover member 50. For example, the end portion of each of the first to third signal lines 92a, 92b, and 92c may be electrically connected to or electrically contact each of the corresponding electrode layers 13 and 15 by a conductive double-sided tape, and thus, an adhesive force to the corresponding electrode layers 13 and 15 may be secured.

The end portion (or the distal end portion) of the signal cable 90 inserted between the first cover member 30 and the second cover member 50 may be inserted or fixed between the first cover member 30 and the second cover member 50 by a film laminating process which uses a first adhesive layer 41 formed at the first cover member 30 and a second adhesive layer 42 formed at the second cover member 50.

Therefore, the first signal line 92a may be maintained with being electrically connected to the first electrode layer 13 of the first vibration portion 10A, the second signal line 92b may be maintained with being electrically connected to the second electrode layer 15 of the second vibration portion 10B, and the third signal line 92c may be maintained with being electrically connected to the second electrode layer 15 of the first vibration portion 10A. In addition, the end portion (or the distal end portion) of the signal cable 90 may be inserted or fixed between the first cover member 30 and the second cover member 50, and thus, a contact defect between the vibration generating portion 10 and the signal cable 90 caused by the movement of the signal cable 90 may be prevented.

In the vibration apparatus according to the first example embodiment of the present disclosure, the first to third signal lines 92a, 92b, and 92c of the signal cable 90 may be connected to the electrode layer of the vibration generating portion 10 between the first cover member 30 and the second cover member 50, and thus, a soldering process for an electrical connection between the vibration generating portion 10 and the signal cable 90 may not be needed, thereby simplifying a structure and a manufacturing process. In addition, the vibration apparatus according to the first example embodiment of the present disclosure may include the plurality of vibration portions 10A and 10B which overlap or stack with each other to vibrate (or displace or drive) in the same direction, and thus, vibration efficiency or a vibration characteristic may be enhanced and a vibration width (or a displacement width) may be maximized, thereby enhancing a sound characteristic and/or a sound pressure level characteristic of the low-pitched sound band.

Figure 5:
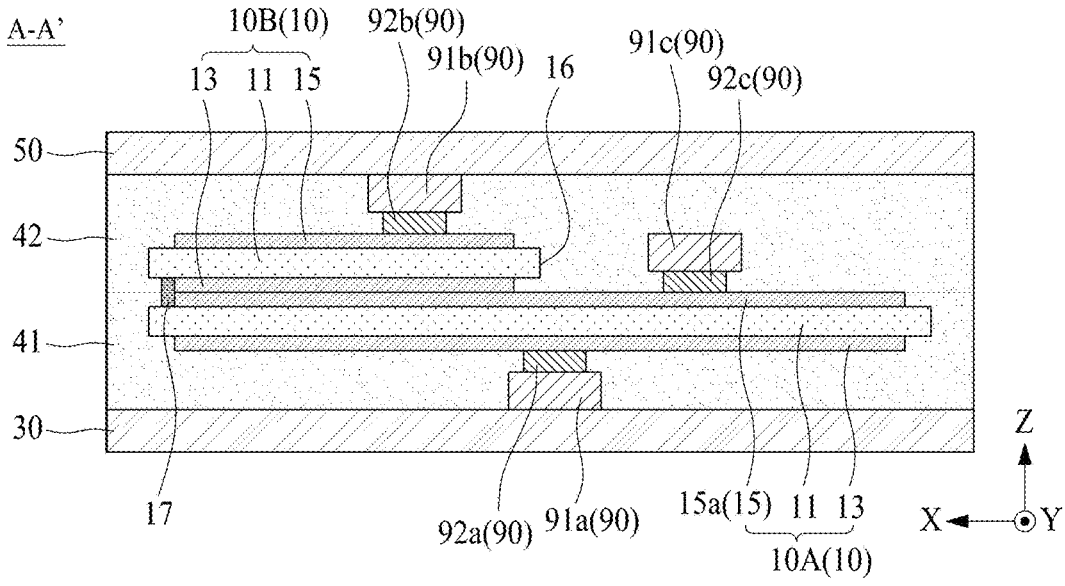
FIG. 5 is an example of another cross-sectional view taken along line A-A' illustrated in FIG. 1.
Figure 6:
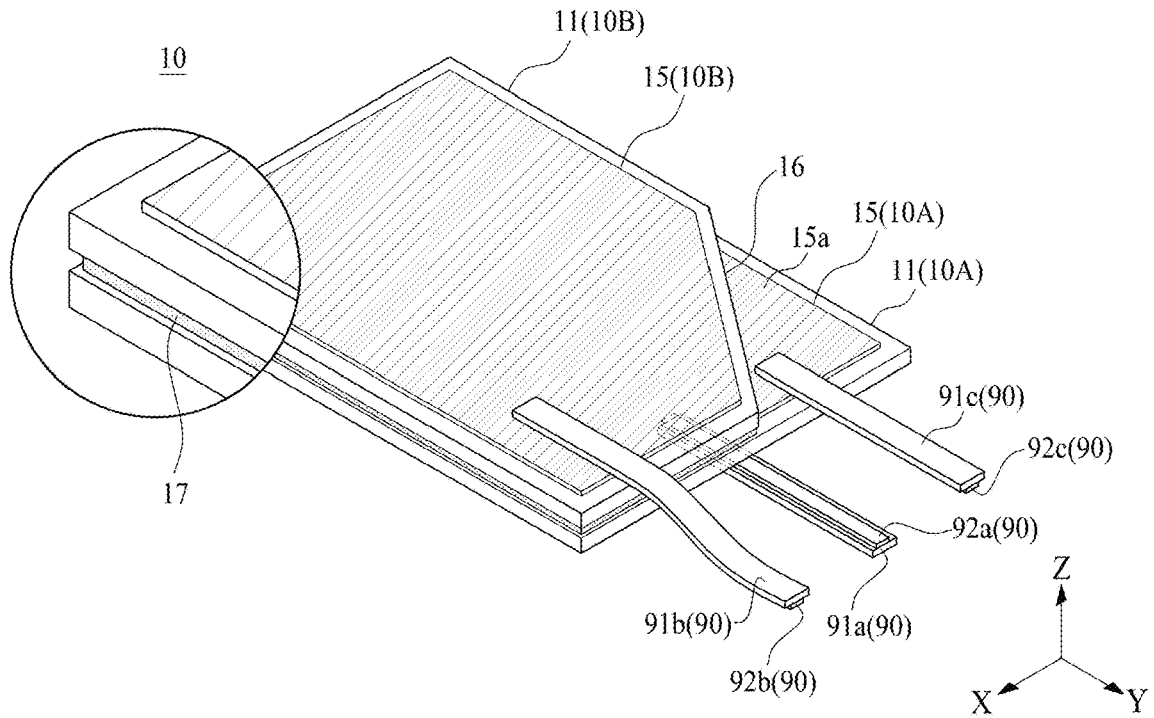
FIG. 6 is an example of a perspective view illustrating a vibration generating portion illustrated in FIG. 5.
Figure 7:
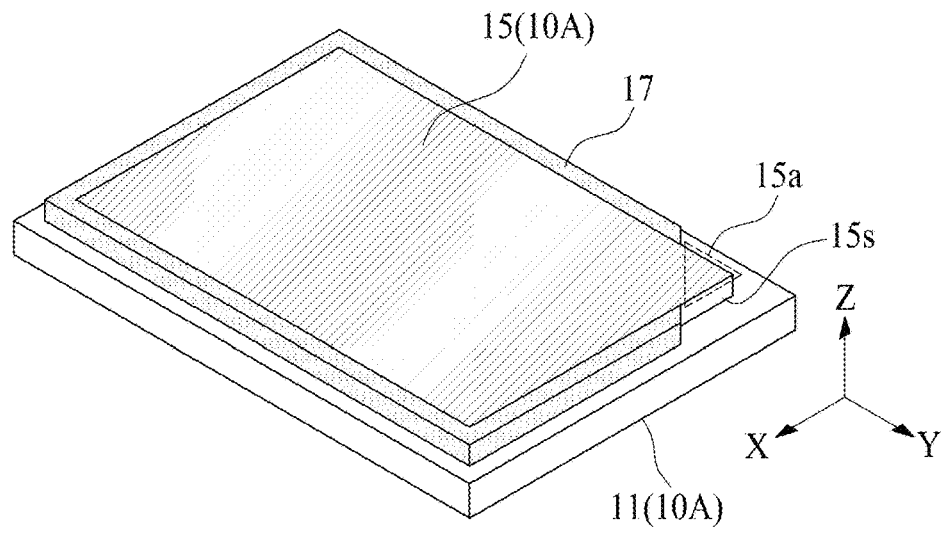
FIG. 7 is an example of a perspective view illustrating an adhesive member disposed at a first vibration portion illustrated in FIGS. 5 and 6.

FIG. 5 is an example of another cross-sectional view taken along line A-A' illustrated in FIG. 1. FIG. 6 is an example of a perspective view illustrating a vibration generating portion illustrated in FIG. 5. FIG. 7 is an example of a perspective view illustrating an adhesive member disposed at a first vibration portion illustrated in FIGS. 5 and 6. FIGS. 5 to 7 illustrate an example embodiment where an adhesive member is additionally provided in the vibration apparatus according to the first example embodiment of the present disclosure described above with reference to FIGS. 1 to 4. Therefore, in descriptions of FIGS. 5 to 7, the elements except an adhesive member and relevant elements may be referred to by like reference numerals, and their repetitive descriptions may be omitted for brevity.

With reference to FIGS. 5 to 7, a vibration apparatus or a vibration generating portion 10 according to a second example embodiment of the present disclosure may further include an adhesive member 17.

The adhesive member 17 may be configured to reinforce an adhesive force between a plurality of vibration portions 10A and 10B disposed in the vibration generating portion 10. The adhesive member 17 may be disposed along a periphery portion between the plurality of vibration portions 10A and 10B. The adhesive member 17 may be formed or disposed at a region (or an overlap region) between the plurality of vibration portions 10A and 10B.

The adhesive member 17 according to an example embodiment of the present disclosure may be formed or disposed between a periphery portion of a first vibration portion 10A and a periphery portion of a second vibration portion 10B. For example, the adhesive member 17 may be formed at a periphery portion of the first vibration portion 10A overlapping the second vibration portion 10B. For example, the adhesive member 17 may surround a lateral surface (or a sidewall) of the first vibration portion 10A (or a second electrode layer 15 of the first vibration portion 10A) except an exposure region 15a of the first vibration portion 10A exposed by a cut portion 16 of the second vibration portion 10B. For example, the adhesive member 17 may be connected or adhered between a periphery portion of a vibration layer 11 of the first vibration portion 10A and a periphery portion of a vibration layer 11 of the second vibration portion 10B. Accordingly, an adhesive force between the first vibration portion 10A and the second vibration portion 10B may be enhanced, and thus, a contact force or an adhesive force between a second electrode layer 15 of the first vibration portion 10A and a first electrode layer 13 of the second vibration portion 10B may be enhanced and a vibration efficiency or a vibration characteristic of each of the first vibration portion 10A and the second vibration portion 10B may be enhanced.

The adhesive member 17 may be spaced apart from a lateral surface (or a sidewall) of a vibration layer 11 of the first vibration portion 10A, and thus, the adhesive member 17 may be prevented from flowing out (or overflowing) in a lateral direction from the first vibration portion 10A and the second vibration portion 10B.

The adhesive member 17 may include an epoxy resin, an acrylic resin, a silicone resin, or a urethane resin, but embodiments of the present disclosure are not limited thereto. For example, the adhesive member 17 may include an acrylic material (or substance), having a characteristic where an adhesive force is relatively strong and hardness is relatively high, of acrylic and urethane. Accordingly, a vibration between the first vibration portion 10A and the second vibration portion 10B may be transferred well, and thus, vibration efficiency or a vibration characteristic may be enhanced.

In the vibration apparatus according to the second example embodiment of the present disclosure, an adhesive force between the first vibration portion 10A and the second vibration portion 10B may be enhanced by the adhesive member 17, and thus, vibration efficiency or a vibration characteristic may be further enhanced.

Figure 8:
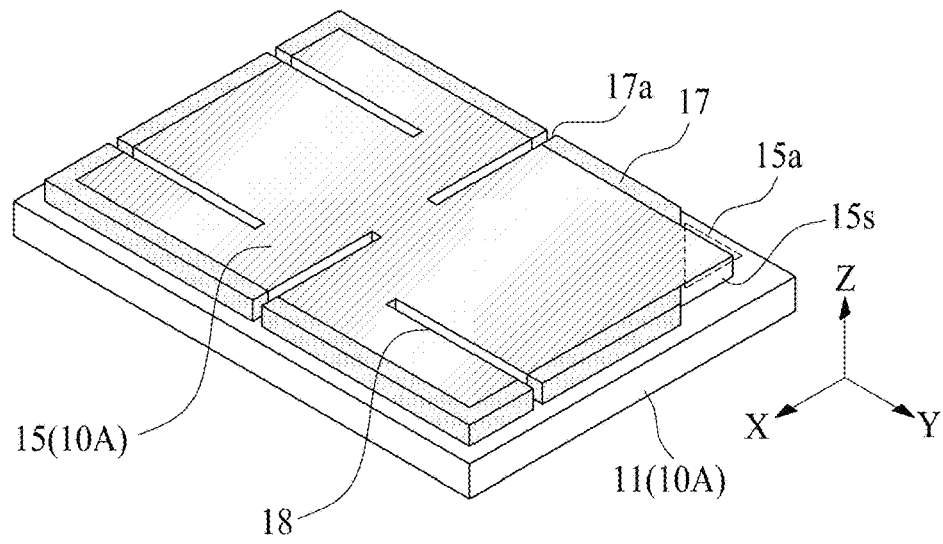
FIG. 8 illustrates a first vibration portion in a vibration apparatus according to a third example embodiment of the present disclosure.

FIG. 8 illustrates a first vibration portion in a vibration apparatus according to a third example embodiment of the present disclosure. FIG. 8 illustrates an example embodiment implemented by modifying the second electrode layer of the first vibration portion in the vibration apparatus illustrated in FIGS. 1 to 7. Therefore, in describing FIG. 8, the elements except a second electrode layer of a first vibration portion and relevant elements may be referred to by like reference numerals, and their repetitive descriptions may be omitted for brevity.

With reference to FIG. 8 in conjunction with FIGS. 2 and 5, the vibration apparatus according to the third example embodiment of the present disclosure may be manufactured or formed through a firing process (or a curing process) performed on an electrode layer.

According to an example embodiment of the present disclosure, a second electrode layer 15 of a first vibration portion 10A and a first electrode layer 13 of a second vibration portion 10B may be directly connected to each other by a firing process. For example, according to a manufacturing process performed on a vibration apparatus, one or more of the second electrode layer 15 of the first vibration portion 10A and the first electrode layer 13 of the second vibration portion 10B may overlap or stack with each other in a state which is pre-cured or not completely cured, and then, may be directly connected to each other or may be chemically and/or physically connected or coupled to each other by a firing process (or a curing process). For example, each of the second electrode layer 15 of the first vibration portion 10A and the first electrode layer 13 of the second vibration portion 10B may be cured or completely cured before a firing process (or a curing process). For example, the second electrode layer 15 of the first vibration portion 10A or the first electrode layer 13 of the second vibration portion 10B may be cured or completely cured before a firing process.

According to an example embodiment of the present disclosure, the second electrode layer 15 of the first vibration portion 10A may include one or more slits 18. The one or more slits 18 may extend from a center portion of the second electrode layer 15 to pass through a lateral surface (or a sidewall) of the second electrode layer 15. The one or more slits 18 may act as a path through which heat and/or outgassing occurring in a firing process are/is discharged.

The vibration apparatus according to the third example embodiment of the present disclosure may include the one or more slits 18 formed at the second electrode layer 15 of the first vibration portion 10A, and thus, outgassing occurring in a firing process may be smoothly discharged, and a stress applied to the vibration layer 11 by heat of the firing process may be minimized.

According to another example embodiment of the present disclosure, the first electrode layer 13 of the second vibration portion 10B may include one or more slits, and even in this case, outgassing may be smoothly discharged, and a stress applied to the vibration layer 11 by heat of a firing process may be minimized. Accordingly, the vibration apparatus according to the third example embodiment of the present disclosure may include one or more slits which are formed at one or more of the second electrode layer 15 of the first vibration portion 10A and the first electrode layer 13 of the second vibration portion 10B, and thus, outgassing occurring in a firing process may be smoothly discharged and a stress applied to the vibration layer 11 by heat of the firing process may be minimized.

The vibration apparatus according to the third example embodiment of the present disclosure may further include the adhesive member 17 described above with reference to FIG. 7, so as to enhance an adhesive force between the first vibration portion 10A and the second vibration portion 10B, and the repetitive description thereof may be omitted for brevity.

The adhesive member 17 may include one or more separation portions 17a which communicate with the one or more slits 18 formed at the second electrode layer 15 of the first vibration portion 10A. Accordingly, outgassing occurring in a firing process may be discharged via the one or more slits 18 formed at the second electrode layer 15 of the first vibration portion 10A and the one or more separation portions 17a formed at the adhesive member 17.

Figure 9:
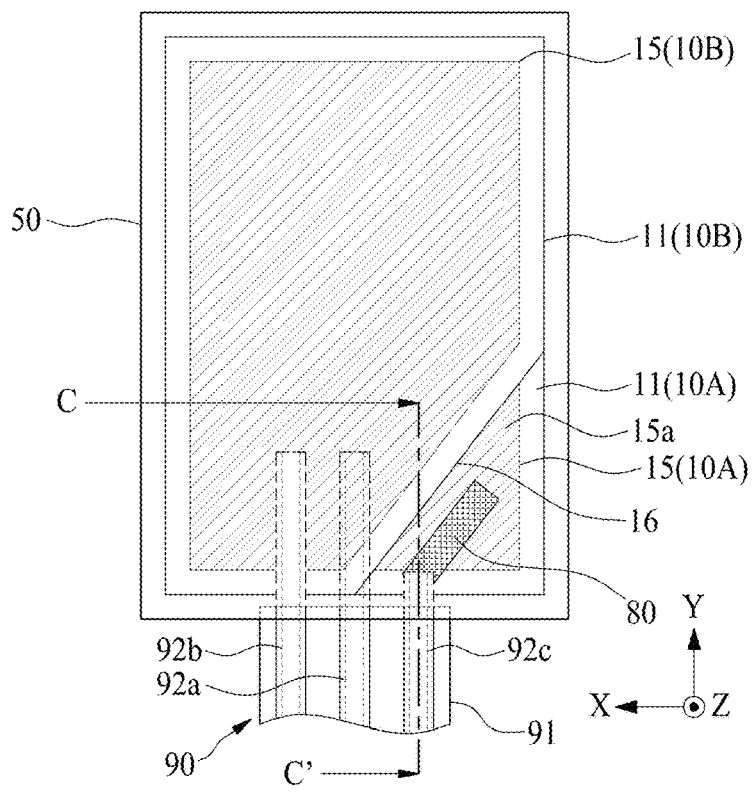
FIG. 9 illustrates a vibration apparatus according to a fourth example embodiment of the present disclosure.
Figure 10:
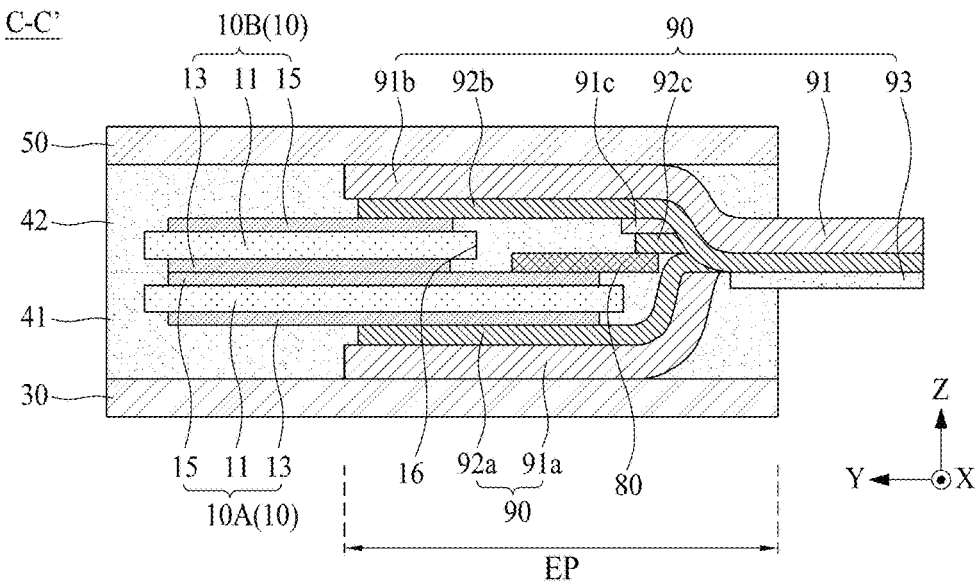
FIG. 10 is an example of a cross-sectional view taken along line C-C' illustrated in FIG. 9.

FIG. 9 illustrates a vibration apparatus according to a fourth example embodiment of the present disclosure. FIG. 10 is an example of a cross-sectional view taken along line C-C' illustrated in FIG. 9. In the vibration apparatus according to the fourth example embodiment of the present disclosure, a third signal line may be connected to a vibration generating portion through a line connection member, and for this reason, the vibration apparatus according to the fourth example embodiment of the present disclosure may differ from the vibration apparatus according to the first to third embodiments of the present disclosure. Hereinafter, only different elements in the vibration apparatus according to the fourth example embodiment of the present disclosure and the vibration apparatus according to the first to third embodiments of the present disclosure will be described, like reference numerals may refer to like elements, and their repetitive descriptions may be omitted for brevity.

With reference to FIGS. 9 and 10, in the vibration apparatus according to the fourth example embodiment of the present disclosure, a line connection member 80 may be electrically connected between a third signal line 92c of a signal cable 90 and a second electrode layer 15 of a first vibration portion 10A. For example, the line connection member 80 may be electrically connected between an end of the third signal line 92c and the second electrode layer 15 of the first vibration portion 10A, between a first cover member 30 and a second cover member 50. Accordingly, a third driving signal supplied to the third signal line 92c by a vibration driving circuit may be supplied to the second electrode layer 15 of the first vibration portion 10A through the line connection member 80. For example, the line connection member 80 may increase a contact area between the third signal line 92c and the second electrode layer 15 of the first vibration portion 10A.

The line connection member 80 may include a conductive double-sided adhesive member. The line connection member 80 may include a conductive double-sided tape, a conductive double-sided adhesive pad, or a conductive double-sided cushion tape, but embodiments of the present disclosure are not limited thereto. The line connection member 80 according to an example embodiment of the present disclosure may include a metal layer, a first tacky layer which is coupled to a first surface of the metal layer and electrically contact or is connected to the second electrode layer 15 of the first vibration portion 10A, and a second tacky layer which is coupled to a second surface of the metal layer and is coupled to or attached on the third signal line 92c of the signal cable 90.

According to an example embodiment of the present disclosure, the metal layer may include a copper (Cu) material, but embodiments of the present disclosure are not limited thereto. Each of the first tacky layer and the second tacky layer may include or contain a conductive material.

The vibration apparatus according to the fourth example embodiment of the present disclosure may have the same effect as the vibration apparatus according to the first to third embodiments of the present disclosure, or a vibration apparatus having the same effect may be provided. In addition, by the line connection member 80, a supply area of a second driving signal applied to the second electrode layer 15 of the first vibration portion 10A may increase, and a vibration efficiency or a vibration characteristic of the vibration generating portion 10 may increase.

According to another example embodiment of the present disclosure, the line connection member 80 may be connected or coupled to a second cover member 50 which overlaps a cut portion 16 of the second vibration portion 10B or overlaps an exposure region 15a of the second electrode layer 15 of the first vibration portion 10A, and in this case, in a laminating process of the vibration apparatus, the line connection member 80 may be electrically connected or coupled to the third signal line 92c and the second electrode layer 15 of the first vibration portion 10A.

Figure 11:
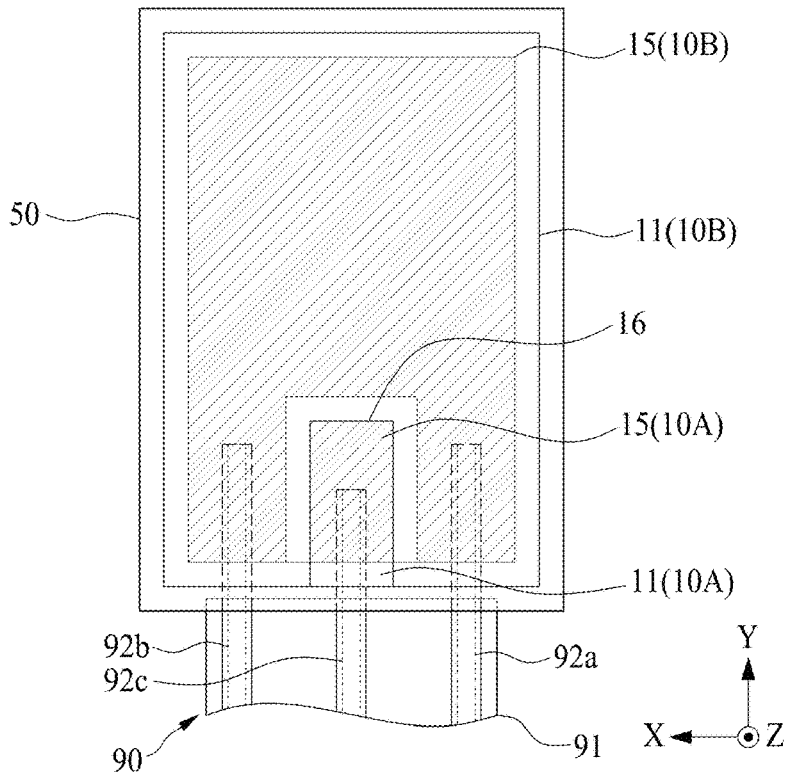
FIG. 11 illustrates a vibration apparatus according to a fifth example embodiment of the present disclosure.
Figure 12:
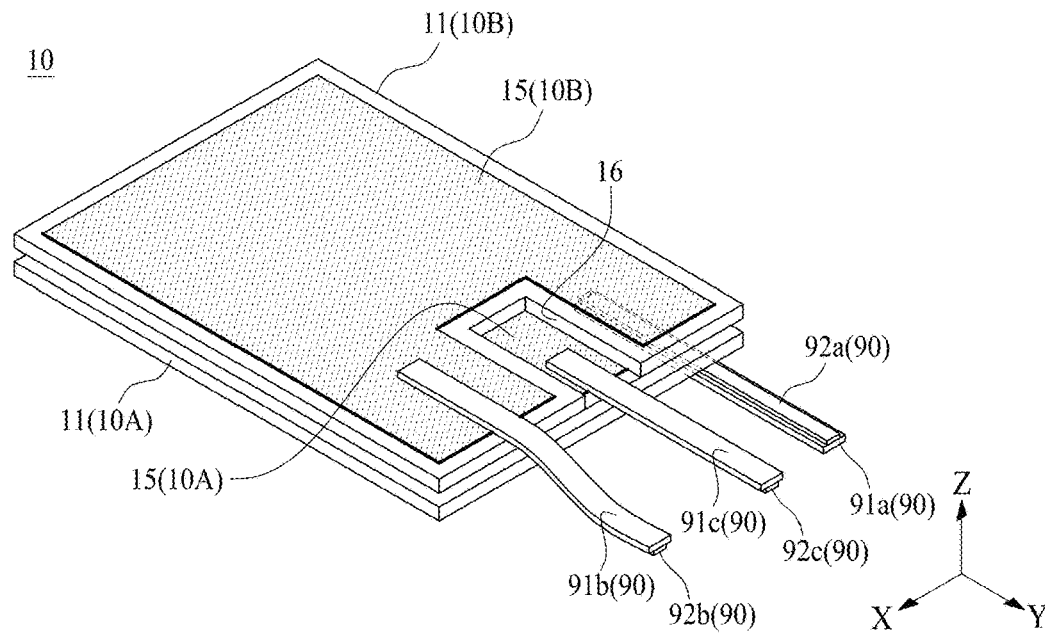
FIG. 12 is an example of a perspective view illustrating a connection structure between a vibration generating portion and a signal line of a signal cable illustrated in FIG. 11.

FIG. 11 illustrates a vibration apparatus according to a fifth example embodiment of the present disclosure. FIG. 12 is an example of a perspective view illustrating a connection structure between a vibration generating portion and a signal line of a signal cable illustrated in FIG. 11. In the vibration apparatus according to the fifth example embodiment of the present disclosure, a cut portion may be implemented in a groove shape, and for this reason, the vibration apparatus according to the fifth example embodiment of the present disclosure may differ from the vibration apparatus according to the first to fourth embodiments of the present disclosure. Hereinafter, only different elements in the vibration apparatus according to the fifth example embodiment of the present disclosure and the vibration apparatus according to the first to fourth embodiments of the present disclosure will be described, like reference numerals may refer to like elements, and their repetitive descriptions may be omitted for brevity.

With reference to FIGS. 11 and 12, the vibration apparatus or a vibration generating portion 10 according to the fifth example embodiment of the present disclosure may be cut so that one side at one periphery portion of a second vibration portion 10B has a predetermined size, and thus, may be implemented.

A cut portion 16 may be implemented to be concave from the one side at the one periphery portion of the second vibration portion 10B. For example, the cut portion 16 may be concavely implemented to include one or more of a rectilinear shape and a curved shape. Therefore, a first vibration portion 10A may one-dimensionally have an M-shape or a U-shape. For example, the cut portion 16 may be implemented in any one of a tetragonal shape, a semi-circular shape, and an oval shape. Accordingly, a second electrode layer 15 of the first vibration portion 10A may face or be exposed at a second cover member 50 through the cut portion 16 of the second vibration portion 10B.

The signal cable 90 may include a first signal line 92a which is electrically connected to or directly contacts at least a portion of a first electrode layer 13 of the first vibration portion 10A, a second signal line 92b which is electrically connected to or directly contacts at least a portion of a second electrode layer 15 of the second vibration portion 10B, and a third signal line 92c which is electrically connected to or directly contacts at least a portion of a second electrode layer 15 of the first vibration portion 10A exposed by the cut portion 16 of the second vibration portion 10B. Except that positions of the first signal line 92a and the third signal line 92c are changed based on a position of the cut portion 16, the signal cable 90 may be substantially the same as the signal cable 90 of the vibration apparatus according to the first to fourth embodiments of the present disclosure, and thus, the repetitive description thereof may be omitted for brevity.

The vibration apparatus according to the fifth example embodiment of the present disclosure may have the same effect as the vibration apparatus according to the first to fourth embodiments of the present disclosure, or a vibration apparatus having the same effect may be provided. In addition, the vibration apparatus according to the fifth example embodiment of the present disclosure may include a cut portion 16 which is implemented to be concave from one side of the second vibration portion 10B, and thus, a contact area (or a connection area) between the third signal line 92c and the second electrode layer 15 of the first vibration portion 10A is exposed by the cut portion 16, whereby a vibration efficiency or a vibration characteristic of the vibration generating portion 10 may increase.

Figure 13A:
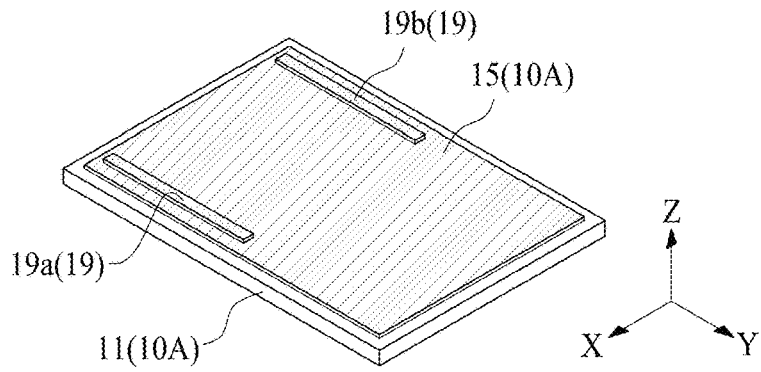
FIGS. 13A to 13C illustrate an adhesive layer of a vibration apparatus according to a sixth example embodiment of the present disclosure.
Figure 13B:
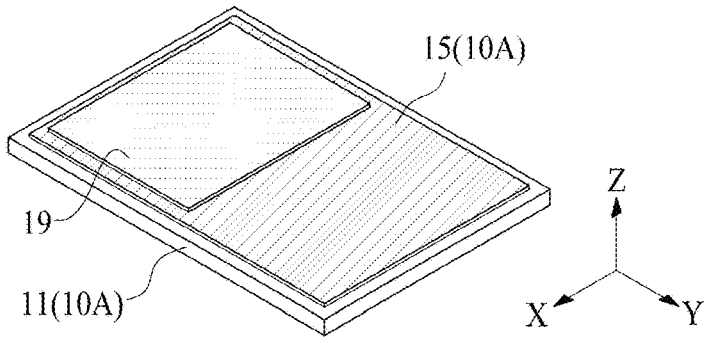
Figure 13C:
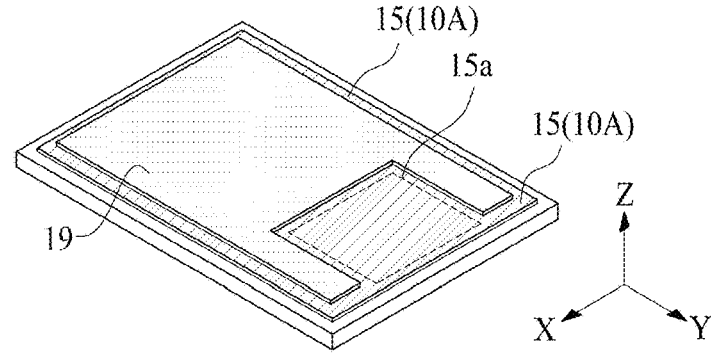

FIGS. 13A, 13B, and 13C illustrate an adhesive layer in a vibration apparatus according to a sixth example embodiment of the present disclosure. In the vibration apparatus according to the sixth example embodiment of the present disclosure, an adhesive layer may be disposed between an electrode layer of a first vibration portion and an electrode layer of a second vibration portion, and for this reason, the vibration apparatus according to the sixth example embodiment of the present disclosure may differ from the vibration apparatus according to the first to fifth embodiments of the present disclosure. Therefore, in describing FIGS. 13A, 13B, and 13C, the elements except an adhesive layer and relevant elements may be referred to by like reference numerals, and their repetitive descriptions may be omitted for brevity.

With reference to FIGS. 12 and 13A, the vibration apparatus according to the sixth example embodiment of the present disclosure may further include an adhesive layer 19.

An adhesive layer (or an inner adhesive layer) 19 according to an example embodiment of the present disclosure may be disposed or formed at a partial region (or some area) of a second electrode layer 15 of a first vibration portion 10A to have a line shape. For example, the adhesive layer 19 may include a pair of adhesive lines 19a and 19b which are disposed at a partial region of the second electrode layer 15 of the first vibration portion 10A.

The pair of adhesive lines 19a and 19b may be arranged in parallel at both periphery portions of the second electrode layer 15 of the first vibration portion 10A. For example, the pair of adhesive lines 19a and 19b may be arranged in parallel with respect to a second direction Y.

The pair of adhesive lines 19a and 19b may be disposed or interposed between the second electrode layer 15 of the first vibration portion 10A and the first electrode layer 13 of the second vibration portion 10B. Accordingly, the second electrode layer 15 of the first vibration portion 10A and the first electrode layer 13 of the second vibration portion 10B may be adhered to each other by an attachment scheme based on the pair of adhesive lines 19a and 19b, and thus, a vibration efficiency or a vibration characteristic of a vibration apparatus may increase, thereby increasing a sound pressure level.

With reference to FIGS. 12 and 13B, an adhesive layer (or an inner adhesive layer) 19 according to an example embodiment of the present disclosure may be disposed in a half region of a second electrode layer 15 of a first vibration portion 10A to correspond to half (50%) of an overlap area (or a facing area) of the second electrode layer 15 of the first vibration portion 10A and a first electrode layer 13 of a second vibration portion 10B. Therefore, the second electrode layer 15 of the first vibration portion 10A and the first electrode layer 13 of the second vibration portion 10B may be adhered to each other by a surface attachment scheme based on an adhesive layer 19 to further enhance an adhesive force, and thus, a vibration efficiency or a vibration characteristic of a vibration apparatus may increase, thereby increasing a sound pressure level.

With reference to FIGS. 12 and 13C, an adhesive layer (or an inner adhesive layer) 19 according to an example embodiment of the present disclosure may be disposed on a second electrode layer 15 of a first vibration portion 10A to correspond to a whole overlap area of the second electrode layer 15 of the first vibration portion 10A and a first electrode layer 13 of a second vibration portion 10B. For example, an adhesive layer 19 may be formed or disposed in the other whole region, except a region overlapping a cut portion 16 of the second vibration portion 10B, of a region of the second electrode layer 15 of the first vibration portion 10A. Therefore, the second electrode layer 15 of the first vibration portion 10A and the first electrode layer 13 of the second vibration portion 10B may be adhered to each other by a total surface attachment scheme based on the adhesive layer 19 to further enhance an adhesive force, and thus, a vibration efficiency or a vibration characteristic of a vibration apparatus may increase, thereby increasing a sound pressure level.

The adhesive layer 19 illustrated in FIGS. 13A, 13B, and 13C may include a pressure sensitive adhesive, an optical adhesive, or a curable epoxy adhesive, but embodiments of the present disclosure are not limited thereto. The adhesive layer 19 may be a conductive adhesive layer including a conductive particle, a conductive nanoparticle, a conductive nanowire, or a conductive ball. The conductive adhesive layer 19 may enhance electrical conductivity and an adhesive force between the second electrode layer 15 of the first vibration portion 10A and the first electrode layer 13 of the second vibration portion 10B, and thus, a vibration efficiency or a vibration characteristic of a vibration apparatus may increase, thereby increasing a sound pressure level.

Figure 14:
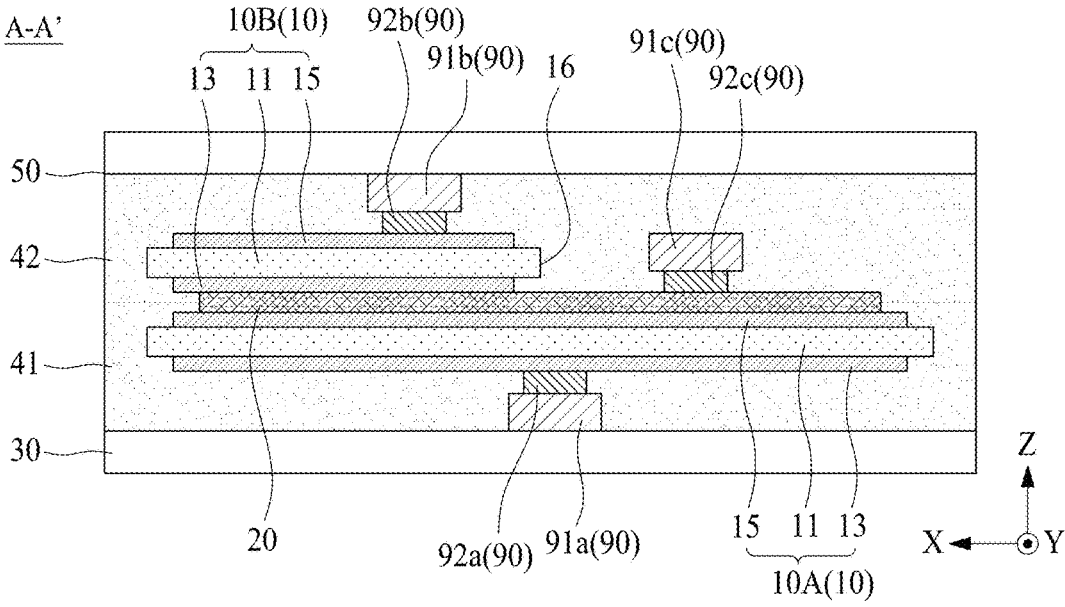
FIG. 14 is an example of another cross-sectional view taken along line A-A' illustrated in FIG. 1.
Figure 15:
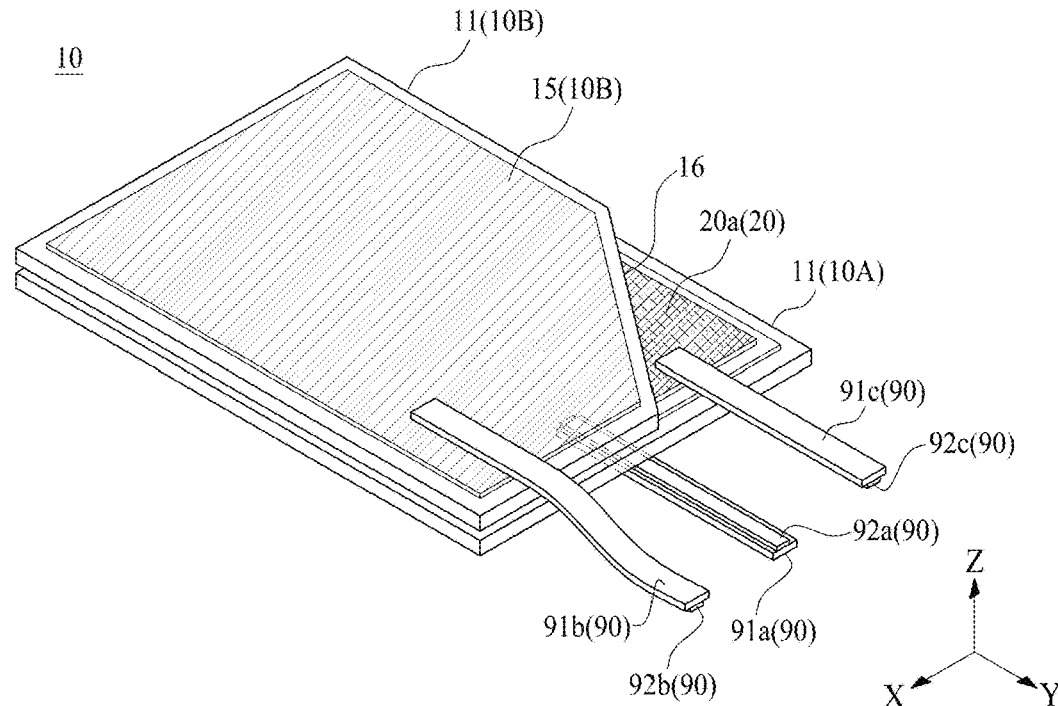
FIG. 15 illustrates an example of a vibration generating portion illustrated in FIG. 14.

FIG. 14 is an example of another cross-sectional view taken along line A-A' illustrated in FIG. 1. FIG. 15 illustrates an example of a vibration generating portion illustrated in FIG. 14. FIGS. 14 and 15 illustrate a vibration apparatus according to a seventh example embodiment of the present disclosure implemented by adding a contact member to the vibration apparatus according to the first example embodiment of the present disclosure. Hereinafter, in describing the vibration apparatus according to the seventh example embodiment of the present disclosure, elements differing from the elements of the vibration apparatus according to the first example embodiment of the present disclosure will be mainly described. The embodiment illustrated in FIG. 14 to FIG. 15 may be applied to the vibration apparatuses according to the second, fourth, and fifth embodiments of the present disclosure.

With reference to FIGS. 1, 14, and 15, the vibration apparatus according to the seventh example embodiment of the present disclosure may further include a contact member 20.

The contact member 20 may be disposed or interposed between a first vibration portion 10A and a second vibration portion 10B. For example, the contact member 20 may be disposed or interposed between a second electrode layer 15 of the first vibration portion 10A and a first electrode layer 13 of the second vibration portion 10B. For example, the contact member 20 may be electrically connected to or electrically contact each of the second electrode layer 15 of the first vibration portion 10A and the first electrode layer 13 of the second vibration portion 10B. For example, the contact member 20 may be an inner connection member, an inner contact member, an electrode contact member, or an interlayer connection member, but embodiments of the present disclosure are not limited thereto.

The contact member 20 according to an example embodiment of the present disclosure may include a conductive double-sided adhesive member. The contact member 20 may include a conductive double-sided tape, a conductive double-sided adhesive pad, or a conductive double-sided cushion tape, but embodiments of the present disclosure are not limited thereto. The contact member 20 according to an example embodiment of the present disclosure may include a metal layer, a first tacky layer which is coupled to a first surface of the metal layer and electrically contact or is connected to the second electrode layer 15 of the first vibration portion 10A, and a second tacky layer which is coupled to a second surface of the metal layer and is coupled to or attached on a third signal line 92c of a signal cable 90.

According to an example embodiment of the present disclosure, the metal layer may include a copper (Cu) material, but embodiments of the present disclosure are not limited thereto. Each of the first tacky layer and the second tacky layer may include or contain a conductive material.

The contact member 20 may have the same shape as the second electrode layer 15 of the first vibration portion 10A. For example, the contact member 20 may have a size which is smaller than or equal to the second electrode layer 15 of the first vibration portion 10A. For example, the contact member 20 may be exposed through a cut portion 16 implemented at the second vibration portion 10B.

An exposure region 20a of the contact member 20 exposed by the cut portion 16 implemented at the second vibration portion 10B may be electrically connected to or electrically contact the third signal line 92c of the signal cable 90. Therefore, a third driving signal supplied to the third signal line 92c of the signal cable 90 may be applied to the second electrode layer 15 of the first vibration portion 10A, and simultaneously, may be applied to the first electrode layer 13 of the second vibration portion 10B through the contact member 20.

In the first vibration portion 10A, the first electrode layer 13 may receive the first driving signal through the first signal line 92a, and the second electrode layer 15 may receive the third driving signal through the third signal line 92c and the contact member 20. Accordingly, the first vibration portion 10A may vibrate (or displace or drive) by alternately repeat contraction and expansion based on an inverse piezoelectric effect occurring in the vibration layer 11 according to the first and third driving signals.

In the second vibration portion 10B, the first electrode layer 13 may receive the third driving signal through the third signal line 92c and the contact member 20, and the second electrode layer 15 may receive the second driving signal through the second signal line 92b. Accordingly, the second vibration portion 10B may vibrate (or displace or drive) by alternately repeat contraction and expansion based on an inverse piezoelectric effect occurring in the vibration layer 11 according to the second and third driving signals.

The vibration apparatus according to the seventh example embodiment of the present disclosure may have the same effect as the vibration apparatus according to the first example embodiment of the present disclosure, or a vibration apparatus having the same effect may be provided. In addition, by the contact member 20, an adhesive force between the second electrode layer 15 of the first vibration portion 10A and the first electrode layer 13 of the second vibration portion 10B may be enhanced, and thus, a vibration efficiency or a vibration characteristic of a vibration apparatus may increase, thereby increasing a sound pressure level.

Figure 16:
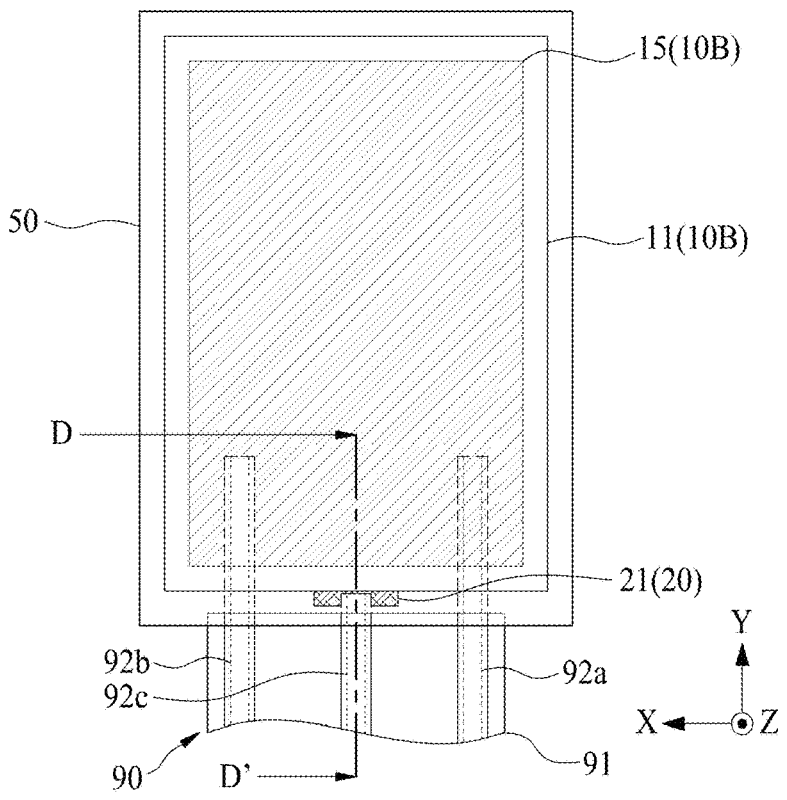
FIG. 16 illustrates a vibration apparatus according to an eighth example embodiment of the present disclosure.
Figure 17:
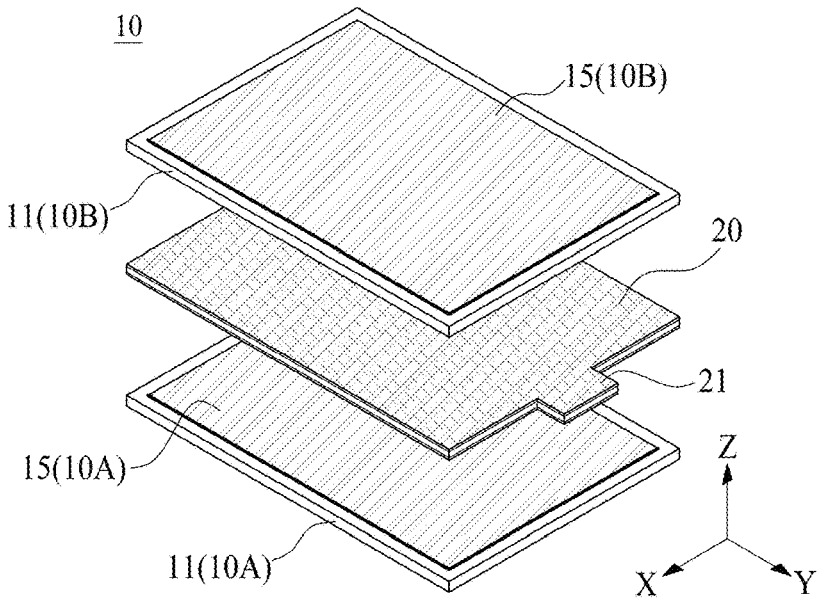
FIG. 17 is an example of an exploded perspective view illustrating a vibration generating portion illustrated in FIG. 16.
Figure 18:
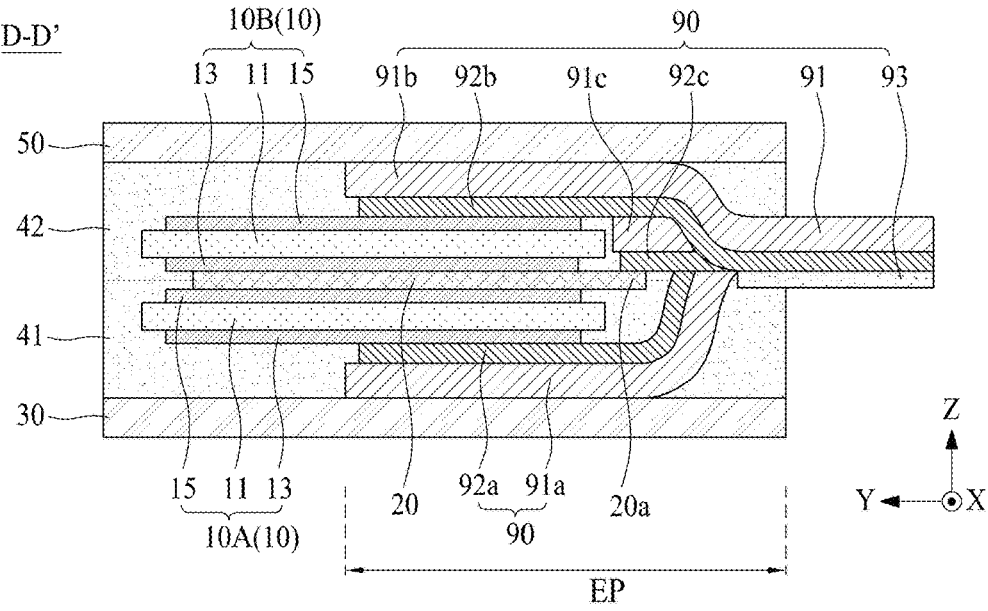
FIG. 18 is an example of a cross-sectional view taken along line D-D' illustrated in FIG. 16.
Figure 19:
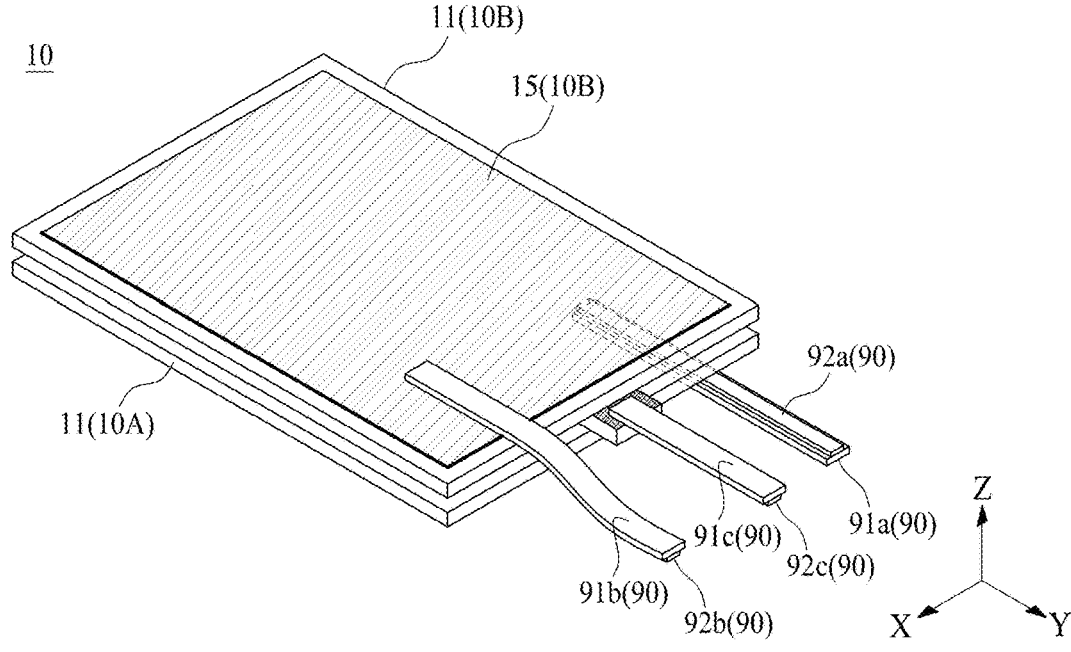
FIG. 19 is an example of a perspective view illustrating a connection structure between a signal cable and the vibration generating portion illustrated in FIG. 16.

FIG. 16 illustrates a vibration apparatus according to an eighth example embodiment of the present disclosure. FIG. 17 is an example of an exploded perspective view illustrating a vibration generating portion illustrated in FIG. 16. FIG. 18 is an example of a cross-sectional view taken along line D-D' illustrated in FIG. 16. FIG. 19 is an example of a perspective view illustrating a connection structure between a signal cable and the vibration generating portion illustrated in FIG. 16. FIGS. 16 to 19 illustrate an example embodiment implemented by modifying the second vibration portion and the contact member in the vibration apparatus according to the seventh example embodiment of the present disclosure. Hereinafter, in describing the vibration apparatus according to the eighth example embodiment of the present disclosure, elements differing from the elements of the vibration apparatus according to the seventh example embodiment of the present disclosure will be mainly described. The embodiment illustrated in FIG. 16 to FIG. 19 may be applied to the vibration apparatuses according to the second, fourth, and fifth embodiments of the present disclosure.

With reference to FIGS. 16 to 19, in the vibration apparatus according to the eighth example embodiment of the present disclosure, a second vibration portion 10B may be implemented to have the same size and the same shape as a first vibration portion 10A. For example, the second vibration portion 10B may overlap or stack the first vibration portion 10A with a contact member 20 therebetween. Accordingly, a second electrode layer 15 of the first vibration portion 10A and a first electrode layer 13 of the second vibration portion 10B may surface-to-surface contact each other through the contact member 20 and an adhesive force between the second electrode layer 15 of the first vibration portion 10A and the first electrode layer 13 of the second vibration portion 10B may be enhanced, and thus, a vibration efficiency or a vibration characteristic of a vibration apparatus may increase, thereby increasing a sound pressure level.

The contact member 20 may include a protrusion portion 21 which is disposed between the first vibration portion 10A and the second vibration portion 10B and protrudes to the outside of one periphery portion of the vibration generating portion 10. For example, the protrusion portion 21 may protrude from one side of the contact member 20 along a second direction Y. For example, the protrusion portion 21 may protrude from the one side of the contact member 20 within a range overlapping each of a first cover member 30 and a second cover member 50.

The signal cable 90 may include a first signal line 92a which is electrically connected to or directly contacts at least a portion of a first electrode layer 13 of the first vibration portion 10A, a second signal line 92b which is electrically connected to or directly contacts at least a portion of a second electrode layer 15 of the second vibration portion 10B, and a third signal line 92c which is electrically connected to or directly contacts at least a portion of the protrusion portion 21 of the contact member 20. Except that positions of the first signal line 92a and the third signal line 92c are changed based on a position of the protrusion portion 21 of the contact member 20, the signal cable 90 may be substantially the same as the signal cable 90 of the vibration apparatus according to the first example embodiment of the present disclosure, and thus, the repetitive description thereof may be omitted for brevity.

The vibration apparatus according to the eighth example embodiment of the present disclosure may have the same effect as the vibration apparatus according to the first example embodiment of the present disclosure, or a vibration apparatus having the same effect may be provided. In addition, by the contact member 20, an adhesive force between the first vibration portion 10A and the second vibration portion 10B may be enhanced, and thus, a vibration efficiency or a vibration characteristic of a vibration apparatus may increase, thereby increasing a sound pressure level. Because the vibration apparatus according to the eighth example embodiment of the present disclosure includes the protrusion portion 21 of the contact member 20, a driving signal may be supplied to a middle electrode layer (or a common electrode layer) of the first vibration portion 10A and the second vibration portion 10B through the protrusion portion 21 of the contact member 20 without forming the cut portion 16 at the second vibration portion 10B, and thus, an area of the second vibration portion 10B may increase, thereby enhancing vibration efficiency or a vibration characteristic.

Figure 20:
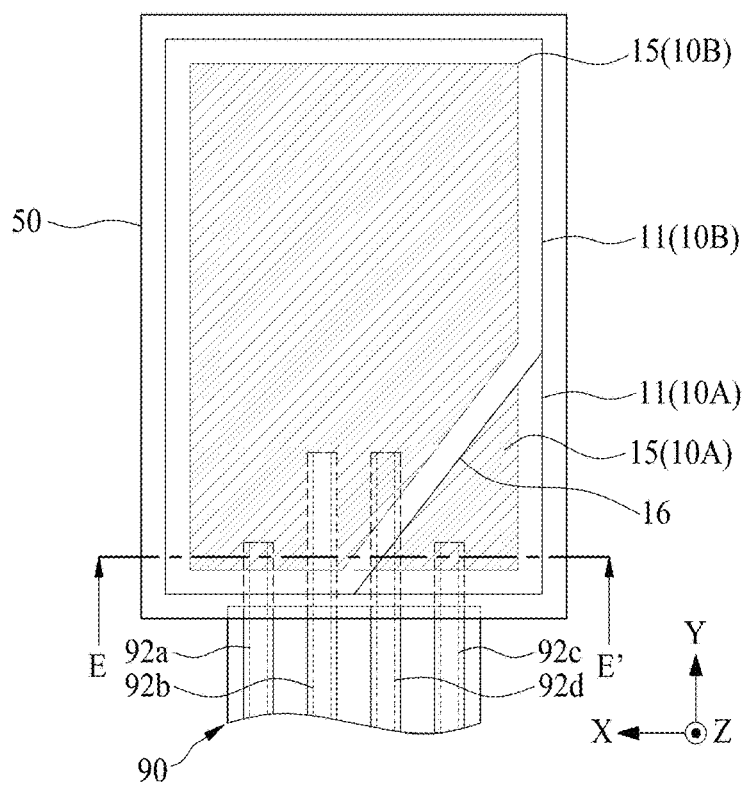
FIG. 20 illustrates a vibration apparatus according to a ninth example embodiment of the present disclosure.
Figure 21:
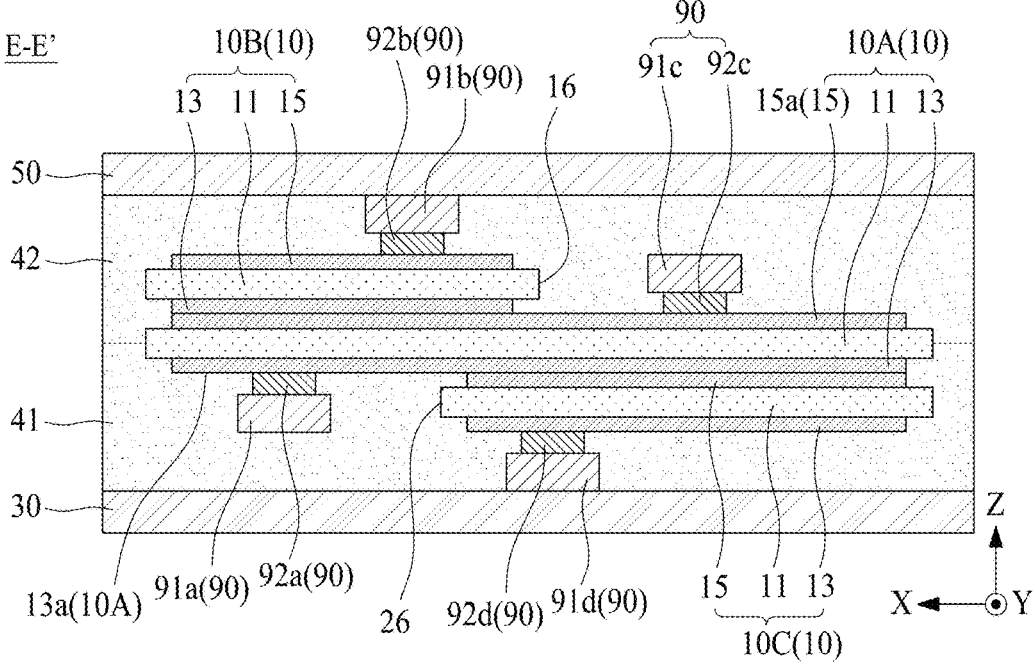
FIG. 21 is a cross-sectional view taken along line E-E' illustrated in FIG. 20.
Figure 22:
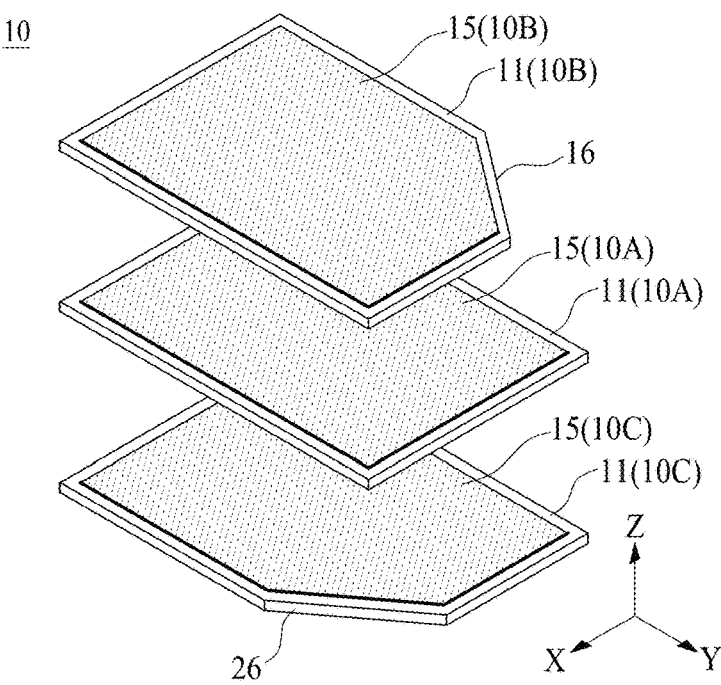
FIG. 22 is an example of an exploded perspective view illustrating a vibration generating portion illustrated in FIG. 21.
Figure 23:
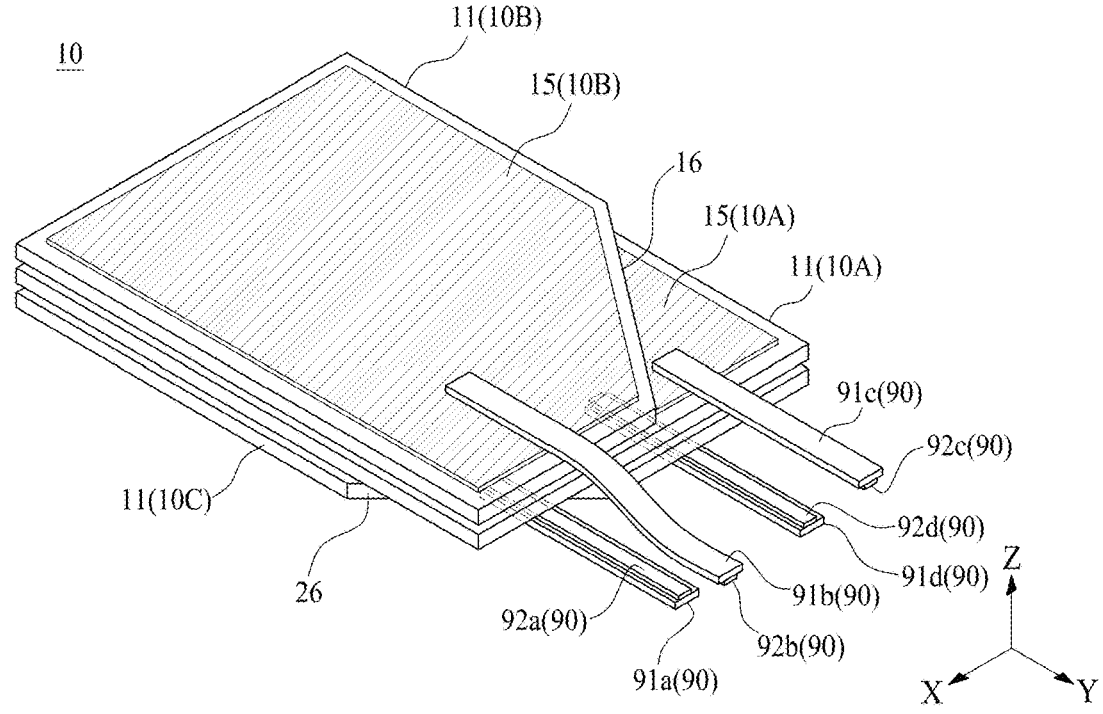
FIG. 23 is an example of a perspective view illustrating a connection structure between a signal cable and the vibration generating portion illustrated in FIG. 20.

FIG. 20 illustrates a vibration apparatus according to a ninth example embodiment of the present disclosure. FIG. 21 is an example of a cross-sectional view taken along line E-E' illustrated in FIG. 20. FIG. 22 is an example of an exploded perspective view illustrating a vibration generating portion illustrated in FIG. 21. FIG. 23 is an example of a perspective view illustrating a connection structure between a signal cable and the vibration generating portion illustrated in FIG. 20. FIGS. 20 to 23 illustrate an example embodiment where a third vibration portion is additionally provided in the vibration apparatus according to the first embodiment and a signal cable is modified. Hereinafter, in describing the vibration apparatus according to the ninth example embodiment of the present disclosure, elements differing from the elements of the vibration apparatus according to the first example embodiment of the present disclosure will be mainly described. The ninth example embodiment of the present disclosure illustrated in FIGS. 20 to 23 may be applied to the vibration apparatuses according to the second to eighth embodiments of the present disclosure. Descriptions of the vibration apparatus according to the second to eighth embodiments of the present disclosure may be included in descriptions of a vibration apparatus illustrated in FIGS. 20 to 23.

With reference to FIGS. 20 to 23, a vibration generating portion 10 of a vibration apparatus according to a ninth example embodiment of the present disclosure may further include a third vibration portion 10C.

The third vibration portion 10C may be disposed between the first vibration portion 10A and the first cover member 30. The third vibration portion 10C may be directly connected to or contact the first vibration portion 10A. For example, the third vibration portion 10C may be stacked or superimposed on the first vibration portion 10A. The third vibration portion 10C and the first vibration portion 10A may be directly connected to or directly contact each other without an intermediate medium such as a connection member or a contact member, or the like.

The third vibration portion 10C may include a piezoelectric material (or an electroactive material) or a piezoelectric element which includes a piezoelectric effect. The third vibration portion 10C may include a vibration layer 11, a first electrode layer 13, and a second electrode layer 15 and may be substantially the same as each of the first and second vibration portions 10A and 10B described above with reference to FIGS. 1 to 4, and thus, the repetitive description thereof may be omitted for brevity.

According to an example embodiment of the present disclosure, the second electrode layer 15 of the third vibration portion 10C may electrically contact or be electrically connected to the first electrode layer 13 of the first vibration portion 10A. For example, the second electrode layer 15 of the third vibration portion 10C may directly contact or be directly connected to the first electrode layer 13 of the first vibration portion 10A. For example, the second electrode layer 15 of the third vibration portion 10C may be directly connected or electrically and directly contact the first electrode layer 13 of the first vibration portion 10A without an intermediate medium such as a connection member or a contact member, or the like. Therefore, the first electrode layer 13 of the first vibration portion 10A and the second electrode layer 15 of the third vibration portion 10C may be a fourth electrode layer, a second middle electrode layer, a second inner electrode layer, and a second common electrode layer of the vibration generating portion 10, but embodiments of the present disclosure are not limited thereto. For example, the second electrode layer 15 of the first vibration portion 10A and the first electrode layer 13 of the third vibration portion 10C may be a third electrode layer, a first middle electrode layer, a first inner electrode layer, and a first common electrode layer of the vibration generating portion 10, but embodiments of the present disclosure are not limited thereto.

The vibration layer 11 of the first vibration portion 10A may be polarized in an opposite direction to the vibration layer 11 of the second vibration portion 10B and may be polarized in the same direction as the vibration layer 11 of the third vibration portion 10C. Accordingly, the first to third vibration portions 10A, 10B, and 10C may be displaced (or vibrated or driven) in the same direction, whereby a vibration width (or a displacement width) of the vibration generating portion 10 may be maximized, and thus, a sound pressure level may be further enhanced.

The vibration apparatus or the vibration generating portion 10 according to the ninth example embodiment of the present disclosure may further include a first cut portion 16 implemented at the second vibration portion 10B and a second cut portion 26 implemented at the third vibration portion 10C.

The first cut portion 16 may be implemented by removing a portion of a region of the second vibration portion 10B, so as to expose a first region of an electrode layer disposed closer to the second cover member 50 among the first and second electrode layers 13 and 15 of the first vibration portion 10A. For example, the first cut portion 16 may be implemented by cutting or chamfering a first corner of four corners of the second vibration portion 10B. For example, the first cut portion 16 may be implemented to include one or more of a rectilinear shape and a curved shape. The first cut portion 16 may be substantially the same as the cut portion 16 described above with reference to FIGS. 1 to 4, and thus, the repetitive description thereof may be omitted for brevity.

The second cut portion 26 may be implemented by removing a portion of a region of the third vibration portion 10C, so as to expose a second region of an electrode layer disposed closer to the first cover member 30 among the first and second electrode layers 13 and 15 of the first vibration portion 10A. For example, the second cut portion 26 may be implemented by cutting or chamfering a second corner of four corners of the third vibration portion 10C. For example, the second cut portion 26 may be implemented by cutting or chamfering the second corner of the four corners of the third vibration portion 10C parallel to the first corner of the four corners of the second vibration portion 10B. For example, the second cut portion 26 may be implemented to include one or more of a rectilinear shape and a curved shape. The second cut portion 26 may be implemented to have a shape which is the same as or different from the first cut portion 16. For example, the second cut portion 26 may be implemented to have a size which is smaller than the first cut portion 16.

According to an example embodiment of the present disclosure, a portion of the first electrode layer 13 of the first vibration portion 10A may be exposed through the second cut portion 26 of the third vibration portion 10C to face the first cover member 30. A portion of the second electrode layer 15 of the first vibration portion 10A may be exposed through the first cut portion 16 of the second vibration portion 10B to face the second cover member 50.

The first cover member 30 may be disposed at a first surface of the vibration generating portion 10. For example, the first cover member 30 may be configured to cover the third vibration portion 10C of the vibration generating portion 10. For example, the first cover member 30 may be configured to cover a first electrode layer 13 of the third vibration portion 10C. Accordingly, the first cover member 30 may protect the first surface of the vibration generating portion 10 or the third vibration portion 10C. For example, the first cover member 30 may protect a first surface of the vibration generating portion 10 and the first electrode layer 13 of the third vibration portion 10C, and may protect an exposure region (or a first exposure region) 13*a* of the first vibration portion 10A exposed by the second cut portion 26.

The second cover member 50 may be disposed at a second surface of the vibration generating portion 10. For example, the second cover member 50 may be configured to cover the second vibration portion 10B of the vibration generating portion 10. For example, the second cover member 50 may be configured to cover a second electrode layer 15 of the second vibration portion 10B. Accordingly, the second cover member 50 may protect the second surface of the vibration generating portion 10 or the second vibration portion 10B. For example, the second cover member 50 may protect a second surface of the vibration generating portion 10 and the second electrode layer 15 of the second vibration portion 10B, and may protect an exposure region (or a second exposure region) 15*a* of the first vibration portion 10A exposed by the first cut portion 16.

The first cover member 30 may be connected or coupled to at least a portion of the first surface of the vibration generating portion 10 or the first electrode layer 13 of the third vibration portion 10C by a first adhesive layer 41. For example, the first cover member 30 may be connected or coupled to at least a portion of the first surface of the vibration generating portion 10 or the first electrode layer 13 of the third vibration portion 10C by a film laminating process using the first adhesive layer 41.

The second cover member 50 may be connected or coupled to at least a portion of the second surface of the vibration generating portion 10 or the second electrode layer 15 of the second vibration portion 10B by a second adhesive layer 42. For example, the second cover member 50 may be connected or coupled to at least a portion of the second surface of the vibration generating portion 10 or the second electrode layer 15 of the second vibration portion 10B by a film laminating process using the second adhesive layer 42.

The signal cable 90 may be implemented to be connected to each of the first to third vibration portions 10A, 10B, and 10C of the vibration generating portion 10 at one side of the vibration generating portion 10. The signal cable 90 may be electrically connected to or directly contact each of the first to the third vibration portions 10A, 10B, and 10C, between the first cover member 30 and the second cover member 50.

The signal cable 90 according to an example embodiment of the present disclosure may include (or may be) a base member 91 and a plurality of signal lines 92*a* to 92*d*. For example, the signal cable 90 may include a base member 91 and first to fourth signal lines 92*a* to 92*d*. Except that the signal cable 90 further includes a fourth signal line 92*d*, the signal cable 90 may be substantially the same as the signal cable 90 of the vibration apparatus according to the first example embodiment of the present disclosure, and thus, the repetitive descriptions of the first to third signal lines 92*a*, 92*b*, and 92*c* may be omitted or may be briefly given below.

An end portion (or a distal end portion) of the first signal line 92*a* may be electrically connected to at least a portion of the exposure region 13*a* of the first electrode layer 13 of the first vibration portion 10A exposed by the second cut portion 26 of the third vibration portion 10C. For example, the end portion of the first signal line 92*a* may be directly connected to or directly contact the first electrode layer 13 of the first vibration portion 10A. Therefore, the first signal line 92*a* may supply a first driving signal, supplied from the vibration driving circuit, to the first electrode layer 13 of the first vibration portion 10A. Accordingly, the first driving signal may be supplied to the second electrode layer 15 of the third vibration portion 10C through the first electrode layer 13 of the first vibration portion 10A.

According to another example embodiment of the present disclosure, the end portion of the first signal line 92*a* may be electrically connected to at least a portion of the exposure region 13*a* of the first electrode layer 13 of the first vibration portion 10A through a first line connection member corresponding to the line connection member 80 described above with reference to FIGS. 9 and 10, and thus, descriptions of the line connection member 80 may be included in the descriptions of FIGS. 20 to 23.

The end portion of the second signal line 92*b* may be electrically connected to at least a portion of the second electrode layer 15 of the second vibration portion 10B. For example, the end portion of the second signal line 92*b* may be directly connected to or directly contact the second electrode layer 15 of the second vibration portion 10B. Therefore, the second signal line 92*b* may supply a second driving signal, supplied from a vibration driving circuit, to the second electrode layer 15 of the second vibration portion 10B. For example, the second driving signal may have the same phase as the first driving signal.

The end portion of the third signal line 92*c* may be electrically connected to at least a portion of the exposure region 15*a* of the second electrode layer 15 of the first vibration portion 10A exposed by the first cut portion 16 of the second vibration portion 10B. For example, the end portion of the third signal line 92*c* may be directly connected to or directly contact the second electrode layer 15 of the first vibration portion 10A. Therefore, the third signal line 92*c* may supply a third driving signal, supplied from the vibration driving circuit, to the second electrode layer 15 of the first vibration portion 10A. Accordingly, the third driving signal may be supplied to the first electrode layer 13 of the second vibration portion 10B through the second electrode layer 15 of the first vibration portion 10A. For example, the third driving signal may have an inverse phase with respect to the first driving signal or the second driving signal.

According to another example embodiment of the present disclosure, the end portion of the third signal line 92*c* may be electrically connected to at least a portion of the exposure region 15*a* of the second electrode layer 15 of the first vibration portion 10A through a second line connection member corresponding to the line connection member 80 described above with reference to FIGS. 9 and 10, and thus, descriptions of the line connection member 80 may be included in descriptions of FIGS. 20 to 23.

The end portion of the fourth signal line 92*d* may be electrically connected to at least a portion of the first electrode layer 13 of the third vibration portion 10C. For example, the end portion of the fourth signal line 92*d* may be directly connected to or directly contact the first electrode layer 13 of the third vibration portion 10C. Therefore, the fourth signal line 92*d* may supply a fourth driving signal, supplied from a vibration driving circuit, to the first electrode layer 13 of the third vibration portion 10C. For example, the fourth driving signal may have the same phase as the third driving signal and may have an inverse phase with respect to the first driving signal or the second driving signal.

In the first vibration portion 10A, the first electrode layer 13 may receive the first driving signal through the first signal line 92*a*, and the second electrode layer 15 may receive the third driving signal through the third signal line 92*c*. Accordingly, the first vibration portion 10A may vibrate (or displace or drive) by alternately repeat contraction and expansion based on an inverse piezoelectric effect occurring in the vibration layer 11 according to the first and third driving signals.

In the second vibration portion 10B, the first electrode layer 13 may receive the third driving signal through the third signal line 92c and the second electrode layer 15 of the first vibration portion 10A, and the second electrode layer 15 may receive the second driving signal through the second signal line 92b. Accordingly, the second vibration portion 10B may vibrate (or displace or drive) by alternately repeat contraction and expansion based on an inverse piezoelectric effect occurring in the vibration layer 11 according to the second and third driving signals.

In the third vibration portion 10C, the first electrode layer 13 may receive the fourth driving signal through the fourth signal line 92d, and the second electrode layer 15 may receive the first driving signal through the first signal line 92a and the first electrode layer 13 of the first vibration portion 10A. Accordingly, the third vibration portion 10C may vibrate (or displace or drive) by alternately repeat contraction and expansion based on an inverse piezoelectric effect occurring in the vibration layer 11 according to the first and fourth driving signals.

Each of the first to third vibration portions 10A, 10B, and 10C may be flexed (or displaced or vibrated or driven) in the same shape. Therefore, in the vibration generating portion 10 or the vibration apparatus, a vibration width (or a displacement width) of each of the first to third vibration portions 10A, 10B, and 10C may be summated and maximized. For example, in the vibration generating portion 10 or the vibration apparatus, a vibration of each of the first to third vibration portions 10A, 10B, and 10C may be reinforced, and thus, vibration efficiency or a vibration characteristic may be enhanced and a vibration width (or a displacement width) may be more maximized, thereby further enhancing a sound characteristic and/or a sound pressure level characteristic of a low-pitched sound band.

The vibration apparatus according to the ninth example embodiment of the present disclosure may have the same effect as the vibration apparatus according to the first example embodiment of the present disclosure, or a vibration apparatus having the same effect may be provided. Because the vibration apparatus according to the ninth example embodiment of the present disclosure includes the first to third vibration portions 10A to 10C which overlap to vibrate (or displace or drive) in the same direction, vibration efficiency or a vibration characteristic may be enhanced and a vibration width (or a displacement width) may be maximized, thereby further enhancing a sound characteristic and/or a sound pressure level characteristic of a low-pitched sound band.

In the vibration apparatus according to the ninth example embodiment of the present disclosure, the vibration generating portion 10 may include the adhesive member described above with reference to FIGS. 5 to 7. For example, the adhesive member may include a first adhesive member disposed between a periphery portion of the first vibration portion 10A and a periphery portion of the second vibration portion 10B, and a second adhesive member disposed between the periphery portion of the first vibration portion 10A and a periphery portion of the third vibration portion 10C, and in this case, an adhesive force between the first to third vibration portions 10A, 10B, and 10C may be enhanced.

In the vibration apparatus according to the ninth example embodiment of the present disclosure, the vibration generating portion 10 may include one or more slits described above with reference to FIG. 8. For example, the one or more slits may be formed at one or more of the second electrode layer 15 of the first vibration portion 10A and the first electrode layer 13 of the second vibration portion 10B and may be formed at one or more of the first electrode layer 13 of the first vibration portion 10A and the second electrode layer 15 of the third vibration portion 10C, and in this case, outgassing occurring in a firing process may be smoothly discharged and a stress applied to the vibration layer 11 by heat of the firing process may be minimized. In the vibration generating portion 10, each of a first adhesive member and a second adhesive member may include one or more separation portions which communicate with the one or more slits, and in this case, outgassing occurring in a firing process may be smoothly discharged.

In the vibration apparatus according to the ninth example embodiment of the present disclosure, the vibration generating portion 10 may include the adhesive layer described above with reference to FIGS. 13A, 13B, and 13C. For example, the adhesive layer may include a first adhesive layer between the second electrode layer 15 of the first vibration portion 10A and the first electrode layer 13 of the second vibration portion 10B, and a second adhesive layer between the first electrode layer 13 of the first vibration portion 10A and the second electrode layer 15 of the third vibration portion 10C, and in this case, an adhesive force between the first to third vibration portions 10A, 10B, and 10C may be enhanced.

In the vibration apparatus according to the ninth example embodiment of the present disclosure, the vibration generating portion 10 may include the contact member described above with reference to FIGS. 14 and 15. For example, the contact member may include a first contact member between the second electrode layer 15 of the first vibration portion 10A and the first electrode layer 13 of the second vibration portion 10B, and a second contact member between the first electrode layer 13 of the first vibration portion 10A and the second electrode layer 15 of the third vibration portion 10C, and in this case, an adhesive force between the first to third vibration portions 10A, 10B, and 10C may be enhanced.

In the vibration apparatus according to the ninth example embodiment of the present disclosure, the vibration generating portion 10 may include the protrusion portion of the contact member described above with reference to FIGS. 16 to 19. For example, the protrusion portion of the contact member may include a first protrusion portion which protrudes from a first contact member and the vibration generating portion 10 and a second protrusion portion which protrudes from a second contact member and the vibration generating portion 10 so as to be spaced apart from the first protrusion portion, the third signal line 92c may be connected to a portion of the first protrusion portion, and the first signal line 92a may be connected to a portion of the second protrusion portion. In this case, an area of each of the second vibration portion 10B and the third vibration portion 10C may increase, thereby enhancing vibration efficiency or a vibration characteristic.

Figure 24:
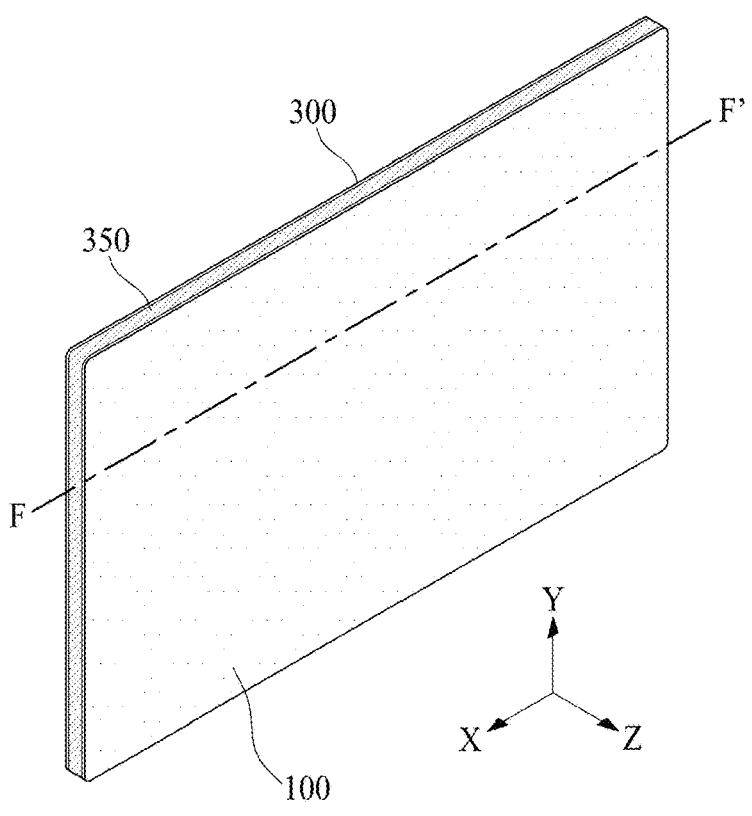
FIG. 24 illustrates an apparatus according to an example embodiment of the present disclosure.
Figure 25:
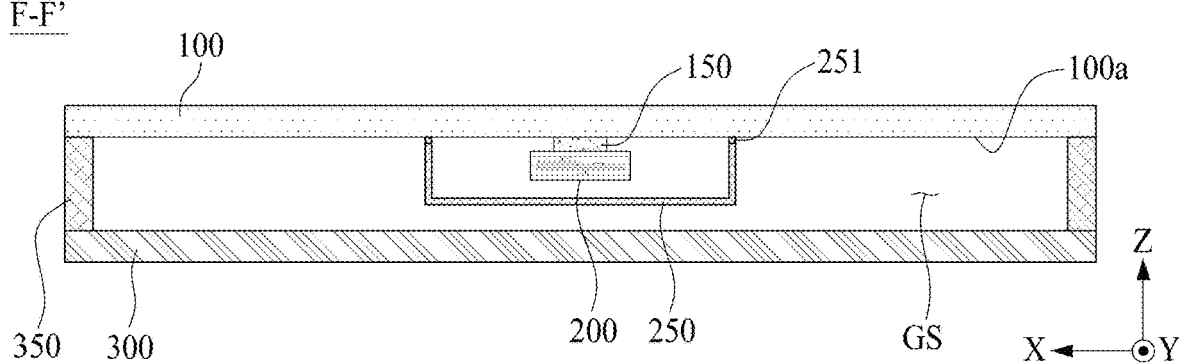
FIG. 25 is an example of a cross-sectional view taken along line F-F' illustrated in FIG. 24.

FIG. 24 illustrates an apparatus according to an example embodiment of the present disclosure. FIG. 25 is an example of a cross-sectional view taken along line F-F' illustrated in FIG. 24.

With reference to FIGS. 24 and 25, the apparatus according to an example embodiment of the present disclosure may include a passive vibration member 100 and one or more vibration generating apparatuses 200.

The apparatus according to an example embodiment of the present disclosure may be applied to implement a display apparatus, a sound apparatus, a sound generating apparatus, a sound bar, an analog signage or a digital signage, or the like, but embodiments of the present disclosure are not limited thereto.

The display apparatus may include a display panel, which includes a plurality of pixels for implementing a black/white or color image, and a driver for driving the display panel. The image according to an example embodiment of the present disclosure may include an electronic image, a digital image, a still image, or a video image, or the like, but embodiments of the present disclosure are not limited thereto. For example, the display panel may be a display panel, such as a liquid crystal display panel, an organic light emitting display panel, a light emitting diode display panel, an electrophoresis display panel, an electro-wetting display panel, a micro light emitting diode display panel, or a quantum dot light emitting display panel, or the like, but embodiments of the present disclosure are not limited thereto. For example, in the organic light emitting display panel, a pixel may include an organic light emitting device such as an organic light emitting layer or the like, and the pixel may be a subpixel which implements any one of a plurality of colors configuring a color image. Accordingly, the apparatus according to an example embodiment of the present disclosure may include a set electronic apparatus or a set device (or a set apparatus) such as a notebook computer, a television, a computer monitor, an equipment apparatus including an automotive apparatus or another type apparatus for vehicles, or a mobile electronic apparatus such as a smartphone or an electronic pad, or the like, which is a complete product (or a final product) including the display panel such as the liquid crystal display panel or the organic light emitting display panel, or the like.

The analog signage may be an advertising signboard, a poster, a noticeboard, or the like. The analog signage may include signage content such as a sentence, a picture, and a sign, or the like. The signage content may be disposed at the passive vibration member 100 of the apparatus to be visible. For example, the signage content may be directly attached on the passive vibration member 100 and the signage content may be printed or the like on a medium such as paper, and the medium may be attached on the passive vibration member 100.

The passive vibration member 100 may vibrate based on driving (or vibration or displacing) of the one or more vibration generating apparatuses 200. For example, the passive vibration member 100 may generate one or more of a vibration and a sound based on driving of the one or more vibration generating apparatuses 200.

The passive vibration member 100 according to an example embodiment of the present disclosure may be a display panel including a display area (or a screen) including a plurality of pixels which implement a black/white or color image. Therefore, the passive vibration member 100 may generate one or more of a vibration and a sound based on driving of the one or more vibration generating apparatuses 200. For example, the passive vibration member 100 may vibrate based on driving of the vibration generating apparatus 200 while displaying an image on the display area, thereby generating or outputting a sound synchronized with the image in the display area. Accordingly, the passive vibration member 100 may be a vibration object, a display member, a display panel, a signage panel, a passive vibration plate, a front cover, a front member, a vibration panel, a sound panel, a passive vibration panel, a sound output plate, a sound vibration plate, or an image screen, or the like, but embodiments of the present disclosure are not limited thereto.

The passive vibration member 100 according to another example embodiment of the present disclosure may include (or may be) a vibration plate which includes a metal material or a nonmetal material (or a composite nonmetal material) having a material characteristic suitable for being vibrated by the one or more vibration generating apparatuses 200 to output sound. For example, the passive vibration member 100 may include a vibration plate which includes one or more materials of metal, plastic, paper, fiber, cloth, wood, leather, rubber, glass, carbon, and a mirror. For example, the paper may be cone for speakers. For example, the cone may be pulp or foamed plastic, or the like, but embodiments of the present disclosure are not limited thereto.

The passive vibration member 100 according to another example embodiment of the present disclosure may include a display panel including a pixel which displays an image, or may include a non-display panel. For example, the passive vibration member 100 may include one or more among a display panel including a pixel displaying an image, a screen panel on which an image is projected from a display apparatus, a lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror, but embodiments of the present disclosure are not limited thereto. For example, the non-display panel may be a light emitting diode lighting panel (or apparatus), an organic light emitting lighting panel (or apparatus), or an inorganic light emitting lighting panel (or apparatus), but embodiments of the present disclosure are not limited thereto.

The one or more vibration generating apparatuses 200 may be configured to vibrate the passive vibration member 100. The one or more vibration generating apparatuses 200 may be configured to be connected to a rear surface 100a of the passive vibration member 100 by a connection member 150. Accordingly, the one or more vibration generating apparatuses 200 may vibrate the passive vibration member 100 to generate or output one or more of a vibration and a sound based on a vibration of the passive vibration member 100.

The one or more vibration generating apparatuses 200 may include one or more of the vibration apparatuses described above with reference to FIGS. 1 to 23. Accordingly, the descriptions of the vibration apparatuses provided above with reference to FIGS. 1 to 23 may be included in the descriptions of the vibration generating apparatus 200 illustrated in FIGS. 24 and 25, and thus, like reference numerals may refer to like elements, and their repetitive descriptions may be omitted for brevity.

The connection member 150 may be disposed between the vibration generating apparatus 200 and the passive vibration member 100. The connection member 150 may be disposed between at least a portion of the vibration generating apparatus 200 and the passive vibration member 100. The connection member 150 according to an example embodiment of the present disclosure may be connected between the passive vibration member 100 and a center portion, except a periphery portion, of the vibration generating apparatus 200. For example, the connection member 150 may be connected between the passive vibration member 100 and the center portion of the vibration generating apparatus 200 based on a partial attachment scheme (or a local bonding scheme). The center portion (or a central portion) of the vibration generating apparatus 200 may be a center of a vibration, and thus, a vibration of the vibration generating apparatus 200 may be effectively transferred to the passive vibration member 100 through the connection member 150. A periphery portion of the vibration generating apparatus 200 may be spaced apart from each of the connection member 150 and the passive vibration member 100 and lifted without being connected to the connection member 150 and/or the passive vibration member 100, and thus, in a flexural vibration (or a bending vibration) of the vibration generating apparatus 200, a vibration of a periphery portion of the vibration generating apparatus 200 may be prevented (or reduced) by the connection member 150 and/or the passive vibration member 100, whereby a vibration amplitude (or a displacement amplitude) of the vibration generating apparatus 200 may increase. Accordingly, a vibration amplitude (or a displacement amplitude) of the passive vibration member 100 based on a vibration of the vibration generating apparatus 200 may increase, and thus, a sound characteristic and/or a sound pressure level characteristic of a low-pitched sound band generated based on a vibration of the passive vibration member 100 may be further enhanced.

The connection member 150 according to another example embodiment of the present disclosure may be connected to or attached on a front surface (or an entire front surface) of each of the one or more vibration generating apparatuses 200 and the rear surface 100a of the passive vibration member 100 based on a whole surface attachment scheme (or an entire surface bonding scheme).

The connection member 150 according to an example embodiment of the present disclosure may include a material including an adhesive layer which is relatively strong in adhesive force or attaching force with respect to each of the one or more vibration generating apparatuses 200 and a rear surface of the display panel or a rear surface of the passive vibration member 100. For example, the connection member 150 may include a foam pad, a double-sided tape, or an adhesive, or the like, but embodiments of the present disclosure are not limited thereto. For example, the adhesive layer of the connection member 150 may include epoxy, acrylic, silicone, or urethane, but embodiments of the present disclosure are not limited thereto. For example, the adhesive layer of the connection member 150 may include an acrylic-based material (or substance), having a characteristic where an adhesive force is relatively strong and hardness is relatively high, of acrylic and urethane. Accordingly, a vibration of the one or more vibration generating apparatuses 200 may be appropriately transferred to the vibration member 100.

The apparatus according to an example embodiment of the present disclosure may further include a supporting member 300 and a coupling member 350.

The supporting member 300 may be disposed at the rear surface 100a of the passive vibration member 100. The supporting member 300 may be disposed at the rear surface 100a of the passive vibration member 100 to cover the one or more vibration generating apparatuses 200. The supporting member 300 may be disposed on the rear surface 100a of the passive vibration member 100 to cover all of the rear surface 100a of the passive vibration member 100 and the one or more vibration generating apparatuses 200. For example, the supporting member 300 may have the same size as the passive vibration member 100. For example, the supporting member 300 may cover a whole rear surface of the passive vibration member 100 with a gap space GS and the one or more vibration generating apparatuses 200 therebetween. The gap space GS may be provided by the coupling member 350 disposed between the passive vibration member 100 and the supporting member 300 facing each other. The gap space GS may be referred to as an air gap, an accommodating space, a vibration space, or a sound sounding box, but embodiments of the present disclosure are not limited thereto.

The supporting member 300 may include any one of a glass material, a metal material, and a plastic material. For example, the supporting member 300 may include a stacked structure in which one or more of a glass material, a plastic material, and a metal material is stacked thereof.

Each of the passive vibration member 100 and the supporting member 300 may have a square shape or a rectangular shape, but embodiments of the present disclosure are not limited thereto, and may have a polygonal shape, a non-polygonal shape, a circular shape, or an oval shape. For example, when the apparatus according to an example embodiment of the present disclosure is applied to a sound apparatus or a sound bar, each of the passive vibration member 100 and the supporting member 300 may have a rectangular shape where a length of a long side is twice or more times longer than a short side, but embodiments of the present disclosure are not limited thereto.

The coupling member 350 may be configured to be connected between a rear periphery portion of the passive vibration member 100 and a front periphery portion of the supporting member 300, and thus, the gap space GS may be provided between the passive vibration member 100 and the supporting member 300 facing each other.

The coupling member 350 according to an example embodiment of the present disclosure may include an elastic material which has adhesive properties and is capable of compression and decompression. For example, the coupling member 350 may include a double-sided tape, a single-sided tape, a double-sided foam tape, or a double-sided adhesive foam pad, but embodiments of the present disclosure are not limited thereto, and may include an elastic pad such as a rubber pad or a silicone pad, or the like, which has adhesive properties and is capable of compression and decompression. For example, the coupling member 350 may be formed by elastomer.

According to another example embodiment of the present disclosure, the supporting member 300 may further include a sidewall portion which supports a rear periphery portion of the passive vibration member 100. The sidewall portion of the supporting member 300 may protrude or be bent toward the rear periphery portion of the passive vibration member 100 from the front periphery portion of the supporting member 300, and thus, the gap space GS may be provided between the passive vibration member 100 and the supporting member 300. For example, the coupling member 350 may be configured to be connected between the sidewall portion of the supporting member 300 and the rear periphery portion of the passive vibration member 100. Accordingly, the supporting member 300 may cover the one or more vibration generating apparatuses 200 and may support the rear surface 100a of the passive vibration member 100. For example, the supporting member 300 may cover the one or more vibration generating apparatuses 200 and may support the rear periphery portion of the passive vibration member 100.

According to another example embodiment of the present disclosure, the passive vibration member 100 may further include a sidewall portion which is connected to a front periphery portion of the supporting member 300. The sidewall portion of the passive vibration member 100 may protrude or be bent toward the front periphery portion of the supporting member 300 from the rear periphery portion of the passive vibration member 100, and thus, the gap space GS may be provided between the passive vibration member 100 and the supporting member 300. A stiffness of the passive vibration member 100 may be increased based on the sidewall portion. For example, the coupling member 350 may be configured to be connected between the sidewall portion of the passive vibration member 100 and the front periphery portion of the supporting member 300. Accordingly, the supporting member 300 may cover the one or more vibration generating apparatuses 200 and may support the rear surface 100a of the passive vibration member 100. For example, the supporting member 300 may cover the one or more vibration generating apparatuses 200 and may support the rear periphery portion of the passive vibration member 100.

The apparatus according to an example embodiment of the present disclosure may further include one or more enclosure 250.

The enclosure 250 may be connected or coupled to the rear periphery portion of the passive vibration member 100 to individually cover the one or more vibration generating apparatuses 200. For example, the enclosure 250 may be connected or coupled to the rear surface 100a of the passive vibration member 100 by a coupling member 251. The enclosure 250 may configure a closed space which covers or surrounds the vibration generating apparatus 200, in the rear surface of the supporting member 300. For example, the enclosure 250 may configure a closed space which covers or surrounds the one or more vibration generating apparatuses 200, in the rear surface 100a of the passive vibration member 100. For example, the enclosure 250 may be a closed member, a closed cap, a closed box, or a sound box, but embodiments of the present disclosure are not limited thereto. The closed space may be an air gap, a vibration space, a sound space, or a sounding box, but embodiments of the present disclosure are not limited thereto.

The enclosure 250 may include one or more materials of a metal material and a nonmetal material (or a composite nonmetal material). For example, the enclosure 250 may include one or more materials of a metal material, plastic, carbon, and wood, but embodiments of the present disclosure are not limited thereto.

The enclosure 250 according to an example embodiment of the present disclosure may maintain an impedance component based on air acting on the passive vibration member 100 when the passive vibration member 100 or the one or more vibration generating apparatuses 200 is vibrating. For example, air around the passive vibration member 100 may resist a vibration of the passive vibration member 100 and may act as an impedance component having a reactance component and a resistance based on a frequency. Therefore, the enclosure 250 may configure a closed space which surrounds the one or more vibration generating apparatuses 200, in the rear surface 100a of the passive vibration member 100, and thus, may maintain an impedance component (or an air impedance or an elastic impedance) acting on the passive vibration member 100 based on air, thereby enhancing a sound characteristic and/or a sound pressure level characteristic of the low-pitched sound band and enhancing the quality of a sound of a high-pitched sound band.

The following Table 1 shows a sound output characteristic of each of the configurations of experimental examples 2 to 6 of an apparatus according to some embodiments of the present disclosure. An experimental example 1 is a mean sound pressure level (SPL) when a vibration generating portion is configured with one vibration portion. The experimental example 2 is a mean sound pressure level when a vibration generating portion is configured by directly stacking two vibration portions, according to an example embodiment of the present disclosure. The experimental example 3 is a mean sound pressure level when a vibration generating portion is configured by stacking two vibration portions through a line attachment scheme, according to an example embodiment of the present disclosure. The experimental example 4 is a mean sound pressure level when a vibration generating portion is configured by stacking two vibration portions Through a partial attachment scheme, according to an example embodiment of the present disclosure. The experimental example 5 is a mean sound pressure level when a vibration generating portion is configured by stacking two vibration portions through a total surface attachment scheme, according to an example embodiment of the present disclosure. The experimental example 6 is a mean sound pressure level when a vibration generating portion is configured by stacking three vibration portions through the total surface attachment scheme, according to an example embodiment of the present disclosure.

The sound output characteristic may be measured by a sound measurement equipment. The sound measurement equipment has used Audio Precision company's APX525 audio analyzer. The sound measurement equipment may be configured to include a sound card that may transmit or receive sound to or from a control personal computer (PC), an amplifier that may amplify a signal generated from the sound card and transfer the amplified signal to a vibration apparatus, and a microphone that may collect sound generated at a display panel based on driving of the vibration apparatus. For example, a microphone may be disposed at a center of a vibration apparatus, and a distance between a display panel and the microphone may be 30 cm. A sound may be measured in a state where the microphone is vertical to a vibration apparatus. The sound collected through the microphone may be input to the control PC through the sound card, and a control program may check the input sound to analyze the sound output characteristic of the apparatus. For example, a frequency response characteristic of a frequency range of 20 Hz to 20 kHz may be measured by a pulse program. A frequency response characteristic may be measured by applying ⅓ octave smoothing in sine sweep at a frequency of 0.15 kHz to 20 KHz.

TABLE 1

| | Mean SPL [dB] (150 Hz to 20 kHz) |
| --- | --- |
| Experimental Example 1 | 71.13 |
| Experimental Example 2 | 72.00 |
| Experimental Example 3 | 75.89 |
| Experimental Example 4 | 74.10 |
| Experimental Example 5 | 76.06 |
| Experimental Example 6 | 72.68 |

With reference to Table 1, it may be seen that a mean sound pressure level is higher in each of the experimental examples 2 to 6 according to an example embodiment of the present disclosure than the experimental example 1 where a vibration generating portion is configured with one vibration portion. Comparing with the experimental example 1, in the experimental example 2, it may be seen that a mean sound pressure level is high. Comparing with the experimental example 1, in each of the experimental examples 3 to 5, it may be seen that a mean sound pressure level increases as an area of an adhesive layer formed between two vibration portions increases.

Accordingly, because the vibration apparatus according to an example embodiment of the present disclosure includes a plurality of vibration portions which overlap or are stacked, a sound characteristic and/or a sound pressure level characteristic may be enhanced, and a sound characteristic and/or a sound pressure level characteristic may be further enhanced based on an area of an adhesive layer between the plurality of vibration portions.

A vibration apparatus and an apparatus including the same according to one or more example embodiments of the present disclosure are described below.

A vibration apparatus according to one or more example embodiments of the present disclosure may comprise a vibration generating portion including a first vibration portion and a second vibration portion overlapping the first vibration portion, a first cover member at a first surface of the vibration generating portion, a second cover member at a second surface different from the first surface of the vibration generating portion, and a signal cable including first, second and third signal lines connected to the first vibration portion and the second vibration portion and disposed between the first cover member and the second cover member.

According to one or more example embodiments of the present disclosure, the second vibration portion may comprise a cut portion exposing a portion of the first vibration portion, and the first vibration portion may comprise an exposure region facing the second cover member through the cut portion.

According to one or more example embodiments of the present disclosure, one of the first, second and third signal lines may be connected to the exposure region of the first vibration portion.

According to one or more example embodiments of the present disclosure, each of the first vibration portion and the second vibration portion may comprise a vibration layer including a piezoelectric material, a first electrode layer at a first surface of the vibration layer, and a second electrode layer at a second surface different from the first surface of the vibration layer.

According to one or more example embodiments of the present disclosure, the first electrode layer of the second vibration portion may contact the second electrode layer of the first vibration portion.

According to one or more example embodiments of the present disclosure, the second vibration portion may comprise a cut portion exposing a portion of the second electrode layer of the first vibration portion, and any one of the first, second and third signal lines may be connected to a portion of the second electrode layer of the first vibration portion exposed by the cut portion of the second vibration portion.

According to one or more example embodiments of the present disclosure, the vibration generating portion may further comprise a line connection member connecting one of the first, second and third signal lines to the second electrode layer of the first vibration portion exposed by the cut portion of the second vibration portion, the second vibration portion may comprise a cut portion exposing a portion of the second electrode layer of the first vibration portion, and one of the first, second and third signal lines may be connected to the second electrode layer of the first vibration portion, exposed by the cut portion of the second vibration portion, through the line connection member.

According to one or more example embodiments of the present disclosure, the second vibration portion may comprise a cut portion exposing a portion of the second electrode layer of the first vibration portion, the first signal line may be connected to the first electrode layer of the first vibration portion, the second signal line may be connected to the second electrode layer of the second vibration portion, and the third signal line may be connected to a portion of the second electrode layer of the first vibration portion exposed by the cut portion of the second vibration portion.

According to one or more example embodiments of the present disclosure, the vibration generating portion may further comprise an adhesive member between a periphery portion of the first vibration portion and a periphery portion of the second vibration portion.

According to one or more example embodiments of the present disclosure, one or more of the second electrode layer of the first vibration portion and the first electrode layer of the second vibration portion may comprise one or more slits.

According to one or more example embodiments of the present disclosure, the vibration generating portion may further comprise an adhesive member between a periphery portion of the first vibration portion and a periphery portion of the second vibration portion, and the adhesive member may comprise one or more separation portions communicating with the one or more slits.

According to one or more example embodiments of the present disclosure, the vibration generating portion may further comprise an adhesive layer between the second electrode layer of the first vibration portion and the first electrode layer of the second vibration portion.

According to one or more example embodiments of the present disclosure, the vibration generating portion may further comprise a contact member between the first vibration portion and the second vibration portion.

According to one or more example embodiments of the present disclosure, the contact member may be a conductive double-sided adhesive member.

According to one or more example embodiments of the present disclosure, the contact member may comprise a protrusion portion protruding from the vibration generating portion, and one of the first, second and third signal lines may be connected to a portion of the protrusion portion.

According to one or more example embodiments of the present disclosure, the vibration generating portion may further comprise a third vibration portion overlapping the first vibration portion, and the signal cable may further comprise a fourth signal line connected to the third vibration portion.

According to one or more example embodiments of the present disclosure, each of the first to third vibration portions may comprise a vibration layer including a piezoelectric material, a first electrode layer at a first surface of the vibration layer, and a second electrode layer at a second surface different from the first surface of the vibration layer.

According to one or more example embodiments of the present disclosure, the first electrode layer of the second vibration portion may contact the second electrode layer of the first vibration portion, and the first electrode layer of the first vibration portion may contact the second electrode layer of the third vibration portion.

According to one or more example embodiments of the present disclosure, the second vibration portion may comprise a first cut portion exposing a first region of the second electrode layer of the first vibration portion, and the third vibration portion may comprise a second cut portion exposing a second region of the first electrode layer of the first vibration portion.

According to one or more example embodiments of the present disclosure, the first signal line may be connected to a portion of the first electrode layer of the first vibration portion exposed by the second cut portion of the third vibration portion, the second signal line may be connected to the second electrode layer of the second vibration portion, the third signal line may be connected to a portion of the second electrode layer of the first vibration portion exposed by the first cut portion of the second vibration portion, and the fourth signal line may be connected to the first electrode layer of the third vibration portion.

According to one or more example embodiments of the present disclosure, the vibration generating portion may further comprise a first line connection member connecting the first signal line to a portion of the first electrode layer of the first vibration portion exposed by the second cut portion of the third vibration portion; and a second line connection member connecting the third signal line to a portion of the second electrode layer of the first vibration portion exposed by the first cut portion of the second vibration portion, the first signal line may be connected to a portion of the first electrode layer of the first vibration portion, exposed by the second cut portion of the third vibration portion, through the first line connection member, and the third signal line may be connected to a portion of the second electrode layer of the first vibration portion, exposed by the first cut portion of the second vibration portion, through the second line connection member.

According to one or more example embodiments of the present disclosure, the vibration generating portion may further comprise a first adhesive member between a periphery portion of the first vibration portion and a periphery portion of the second vibration portion; and a second adhesive member between a periphery portion of the first vibration portion and a periphery portion of the third vibration portion.

According to one or more example embodiments of the present disclosure, one or more of the second electrode layer of the first vibration portion and the first electrode layer of the second vibration portion may comprise one or more slits, and one or more of the first electrode layer of the first vibration portion and the second electrode layer of the third vibration portion may comprise one or more slits.

According to one or more example embodiments of the present disclosure, the vibration generating portion may further comprise a first adhesive member between a periphery portion of the first vibration portion and a periphery portion of the second vibration portion; and a second adhesive member between a periphery portion of the first vibration portion and a periphery portion of the third vibration portion, and each of the first adhesive member and the second adhesive member may comprise one or more separation portions communicating with the one or more slits.

According to one or more example embodiments of the present disclosure, the vibration generating portion may further comprise a first adhesive layer between the second electrode layer of the first vibration portion and the first electrode layer of the second vibration portion, and a second adhesive layer between the first electrode layer of the first vibration portion and the second electrode layer of the third vibration portion.

According to one or more example embodiments of the present disclosure, the vibration generating portion may further comprise a first contact member between the first vibration portion and the second vibration portion, and a second contact member between the first vibration portion and the third vibration portion.

According to one or more example embodiments of the present disclosure, each of the first contact member and the second contact member may be a conductive double-sided adhesive member.

According to one or more example embodiments of the present disclosure, the first contact member may comprise a first protrusion portion protruding from the vibration generating portion, the second contact member may comprise a second protrusion portion protruding from the vibration generating portion, the first signal line may be connected to a portion of the second protrusion portion, and the third signal line may be connected to a portion of the first protrusion portion.

An apparatus according to one or more example embodiments of the present disclosure may comprise a passive vibration member, and a vibration generating apparatus connected to the passive vibration member to vibrate the passive vibration member, where the vibration generating apparatus may comprise a vibration apparatus. The vibration apparatus may comprise a vibration generating portion including a first vibration portion and a second vibration portion overlapping the first vibration portion, a first cover member at a first surface of the vibration generating portion, a second cover member at a second surface different from the first surface of the vibration generating portion, and a signal cable including first, second and third signal lines connected to the first vibration portion and the second vibration portion and disposed between the first cover member and the second cover member. The vibration apparatus may be further configured in accordance with one or more example embodiments of the present disclosure described herein.

According to one or more example embodiments of the present disclosure, the apparatus may further comprise an enclosure at a rear surface of the passive vibration member to cover the vibration generating apparatus.

According to one or more example embodiments of the present disclosure, the passive vibration member may comprise one or more of metal, plastic, paper, fiber, cloth, leather, wood, rubber, glass, carbon, and mirror.

An apparatus according to one or more example embodiments of the present disclosure may comprise a passive vibration member, a connection member, and a vibration generating apparatus connected to the passive vibration member by the connection member to vibrate the passive vibration member, where the vibration generating apparatus may comprise a vibration apparatus. The vibration apparatus may comprise a vibration generating portion including a first vibration portion and a second vibration portion overlapping the first vibration portion, a first cover member at a first surface of the vibration generating portion, a second cover member at a second surface different from the first surface of the vibration generating portion, and a signal cable including first, second and third signal lines connected to the first vibration portion and the second vibration portion and disposed between the first cover member and the second cover member.

According to one or more example embodiments of the present disclosure, the connection member may be connected between the passive vibration member and a center portion of the vibration generating apparatus. A periphery portion of the vibration generating apparatus may be spaced apart from each of the connection member and the passive vibration member and lifted without being connected to the connection member and/or the passive vibration member.

According to one or more example embodiments of the present disclosure, the connection member may include a material including an adhesive layer. The connection member may be connected to or attached on an entire front surface of the vibration generating apparatus and a rear surface of the passive vibration member.

According to one or more example embodiments of the present disclosure, the passive vibration member may comprise one or more of a display panel including a pixel configured to display an image, a screen panel on which an image is to be projected from a display apparatus, a light emitting diode lighting panel, an organic light emitting lighting panel, an inorganic light emitting lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror.

A vibration apparatus according to one or more example embodiments of the present disclosure may be applied to a vibration apparatus disposed at an apparatus. The apparatus according to one or more example embodiments of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the vibration generating apparatus according to one or more example embodiments of the present disclosure may be applied to organic light-emitting lighting apparatuses or inorganic light-emitting lighting apparatuses. When the vibration generating apparatus is applied to lighting apparatuses, the vibration apparatus or the vibration generating apparatus may act as lighting and a speaker, but embodiments of the present disclosure are not limited thereto.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. A vibration apparatus, comprising:
a vibration generating portion including a first vibration portion and a second vibration portion overlapping the first vibration portion;
a first cover member at a first surface of the vibration generating portion;
a second cover member at a second surface different from the first surface of the vibration generating portion; and
a signal cable including first, second and third signal lines connected to the first vibration portion and the second vibration portion and disposed between the first cover member and the second cover member, wherein the vibration generating portion further comprises:
a first adhesive layer between the first cover member and the first surface of the vibration generating portion; and
a second adhesive layer between the second cover member and the second surface of the vibration generating portion,
wherein an end portion of the signal cable is accommodated at a portion between one periphery portion of the first cover member and one periphery portion of the second cover member,
wherein the signal cable is integrated with the vibration generating portion,
wherein each of the first to third signal lines of the signal cable protrudes from the end portion of the signal cable, and
wherein in the portion between the one periphery portion of the first cover member and the one periphery portion of the second cover member, the first adhesive layer is between the first cover member and the end portion of the signal cable, and the second adhesive layer is between the second cover member and the end portion of the signal cable.

2. The vibration apparatus of claim 1,
wherein the second vibration portion comprises a cut portion exposing a portion of the first vibration portion, and
wherein the first vibration portion comprises an exposure region facing the second cover member through the cut portion.

3. The vibration apparatus of claim 2, wherein one of the first, second and third signal lines is connected to the exposure region of the first vibration portion.

4. The vibration apparatus of claim 1, wherein each of the first vibration portion and the second vibration portion comprises:
a vibration layer including a piezoelectric material;
a first electrode layer at a first surface of the vibration layer; and
a second electrode layer at a second surface different from the first surface of the vibration layer.

5. The vibration apparatus of claim 4, wherein the first electrode layer of the second vibration portion contacts the second electrode layer of the first vibration portion.

6. The vibration apparatus of claim 5, wherein:
the second vibration portion comprises a cut portion exposing a portion of the second electrode layer of the first vibration portion; and
one of the first, second and third signal lines is connected to a portion of the second electrode layer of the first vibration portion exposed by the cut portion of the second vibration portion.

7. The vibration apparatus of claim 5, wherein:
the second vibration portion comprises a cut portion exposing a portion of the second electrode layer of the first vibration portion;
the vibration generating portion further comprises a line connection member connecting one of the first, second and third signal lines to the second electrode layer of the first vibration portion exposed by the cut portion of the second vibration portion; and
one of the first, second and third signal lines is connected to the second electrode layer of the first vibration portion, exposed by the cut portion of the second vibration portion, through the line connection member.

8. The vibration apparatus of claim 5, wherein:

the second vibration portion comprises a cut portion exposing a portion of the second electrode layer of the first vibration portion;

the first signal line is connected to the first electrode layer of the first vibration portion, the second signal line is connected to the second electrode layer of the second vibration portion; and the third signal line is connected to a portion of the second electrode layer of the first vibration portion exposed by the cut portion of the second vibration portion.

9. The vibration apparatus of claim 1, wherein the vibration generating portion further comprises an adhesive member between a periphery portion of the first vibration portion and a periphery portion of the second vibration portion.

10. The vibration apparatus of claim 4, wherein one or more of the second electrode layer of the first vibration portion and the first electrode layer of the second vibration portion comprise one or more slits.

11. The vibration apparatus of claim 10, wherein:

the vibration generating portion further comprises an adhesive member between a periphery portion of the first vibration portion and a periphery portion of the second vibration portion; and the adhesive member comprises one or more separation portions communicating with the one or more slits.

12. The vibration apparatus of claim 4, wherein the vibration generating portion further comprises an adhesive layer between the second electrode layer of the first vibration portion and the first electrode layer of the second vibration portion.

13. The vibration apparatus of claim 1, wherein the vibration generating portion further comprises a contact member between the first vibration portion and the second vibration portion.

14. The vibration apparatus of claim 13, wherein the contact member is a conductive double-sided adhesive member.

15. The vibration apparatus of claim 13, wherein:

the contact member comprises a protrusion portion protruding from the vibration generating portion; and one of the first, second and third signal lines is connected to a portion of the protrusion portion.

16. The vibration apparatus of claim 1, wherein:

the vibration generating portion further comprises a third vibration portion overlapping the first vibration portion; and the signal cable further comprises a fourth signal line connected to the third vibration portion.

17. The vibration apparatus of claim 16, wherein each of the first, second and third vibration portions comprises:

a vibration layer including a piezoelectric material;

a first electrode layer at a first surface of the vibration layer; and a second electrode layer at a second surface different from the first surface of the vibration layer.

18. The vibration apparatus of claim 17, wherein:

the first electrode layer of the second vibration portion contacts the second electrode layer of the first vibration portion; and the first electrode layer of the first vibration portion contacts the second electrode layer of the third vibration portion.

19. The vibration apparatus of claim 17, wherein:

the second vibration portion comprises a first cut portion exposing a first region of the second electrode layer of the first vibration portion; and the third vibration portion comprises a second cut portion exposing a second region of the first electrode layer of the first vibration portion.

20. The vibration apparatus of claim 19, wherein:

the first signal line is connected to a portion of the first electrode layer of the first vibration portion exposed by the second cut portion of the third vibration portion;

the second signal line is connected to the second electrode layer of the second vibration portion;

the third signal line is connected to a portion of the second electrode layer of the first vibration portion exposed by the first cut portion of the second vibration portion; and the fourth signal line is connected to the first electrode layer of the third vibration portion.

21. The vibration apparatus of claim 20, wherein the vibration generating portion further comprises:

a first line connection member connecting the first signal line to the portion of the first electrode layer of the first vibration portion exposed by the second cut portion of the third vibration portion; and a second line connection member connecting the third signal line to the portion of the second electrode layer of the first vibration portion exposed by the first cut portion of the second vibration portion, wherein the first signal line is connected to the portion of the first electrode layer of the first vibration portion, exposed by the second cut portion of the third vibration portion, through the first line connection member, and wherein the third signal line is connected to the portion of the second electrode layer of the first vibration portion, exposed by the first cut portion of the second vibration portion, through the second line connection member.

22. The vibration apparatus of claim 16, wherein the vibration generating portion further comprises:

a first adhesive member between a periphery portion of the first vibration portion and a periphery portion of the second vibration portion; and a second adhesive member between a periphery portion of the first vibration portion and a periphery portion of the third vibration portion.

23. The vibration apparatus of claim 17, wherein:

one or more of the second electrode layer of the first vibration portion and the first electrode layer of the second vibration portion comprise one or more slits; and one or more of the first electrode layer of the first vibration portion and the second electrode layer of the third vibration portion comprise one or more slits.

24. The vibration apparatus of claim 23, wherein the vibration generating portion further comprises:

a first adhesive member between a periphery portion of the first vibration portion and a periphery portion of the second vibration portion; and a second adhesive member between a periphery portion of the first vibration portion and a periphery portion of the third vibration portion, wherein each of the first adhesive member and the second adhesive member comprises one or more separation portions communicating with the one or more slits.

25. The vibration apparatus of claim 17, wherein:

the first adhesive layer is between the second electrode layer of the first vibration portion and the first electrode layer of the second vibration portion; and the second adhesive layer is between the first electrode layer of the first vibration portion and the second electrode layer of the third vibration portion.

26. The vibration apparatus of claim 16, wherein the vibration generating portion further comprises:

a first contact member between the first vibration portion and the second vibration portion; and a second contact member between the first vibration portion and the third vibration portion.

27. The vibration apparatus of claim 26, wherein each of the first contact member and the second contact member is a conductive double-sided adhesive member.

28. The vibration apparatus of claim 26, wherein:

the first contact member comprises a first protrusion portion protruding from the vibration generating portion;

the second contact member comprises a second protrusion portion protruding from the vibration generating portion;

the first signal line is connected to a portion of the second protrusion portion; and the third signal line is connected to a portion of the first protrusion portion.

29. An apparatus for vibration, comprising:

a passive vibration member; and a vibration generating apparatus connected to the passive vibration member to vibrate the passive vibration member, wherein the vibration generating apparatus comprises the vibration apparatus of claim 1.

30. The apparatus of claim 29, further comprising an enclosure at a rear surface of the passive vibration member to cover the vibration generating apparatus.

31. The apparatus of claim 29, wherein the passive vibration member comprises one or more of metal, plastic, paper, fiber, cloth, leather, wood, rubber, glass, carbon, and mirror.

32. The apparatus of claim 29, wherein the passive vibration member comprises one or more of a display panel including a pixel configured to display an image, a screen panel on which an image is to be projected from a display apparatus, a light emitting diode lighting panel, an organic light emitting lighting panel, an inorganic light emitting lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror.

33. An apparatus for vibration, comprising:

a passive vibration member;

a connection member; and a vibration generating apparatus connected to the passive vibration member by the connection member to vibrate the passive vibration member, wherein the vibration generating apparatus comprises the vibration apparatus of claim 1.

34. The apparatus of claim 33, wherein the connection member is connected between the passive vibration member and a center portion of the vibration generating apparatus, and wherein a periphery portion of the vibration generating apparatus is spaced apart from each of the connection member and the passive vibration member and lifted without being connected to at least one of the connection member and the passive vibration member.

35. The apparatus of claim 33, wherein the connection member includes a material including an adhesive layer, and wherein the connection member is connected to or attached on an entire front surface of the vibration generating apparatus and a rear surface of the passive vibration member.

* * * * *